(12) United States Patent
Sugita

(10) Patent No.: US 7,684,629 B2
(45) Date of Patent: Mar. 23, 2010

(54) DATA COMPRESSION APPARATUS, AND DATA COMPRESSION PROGRAM STORAGE MEDIUM

(75) Inventor: Yukio Sugita, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 927 days.

(21) Appl. No.: 11/042,535

(22) Filed: Jan. 26, 2005

(65) Prior Publication Data

US 2005/0163387 A1  Jul. 28, 2005

(30) Foreign Application Priority Data

Jan. 26, 2004 (JP) ............................. 2004-016430
Mar. 3, 2004 (JP) ............................. 2004-058645

(51) Int. Cl.
*G06K 9/36* (2006.01)
*G06K 9/46* (2006.01)

(52) U.S. Cl. ..................... 382/239; 382/345

(58) Field of Classification Search ...................... None
See application file for complete search history.

(56) References Cited

U.S. PATENT DOCUMENTS

| | | | | |
|---|---|---|---|---|
| 4,005,411 A | * | 1/1977 | Morrin, II | 341/63 |
| 4,602,383 A | * | 7/1986 | Ogawa et al. | 382/245 |
| 5,138,673 A | * | 8/1992 | Yoshida et al. | 382/238 |
| 5,347,266 A | * | 9/1994 | Bauman et al. | 345/471 |
| 5,506,580 A | * | 4/1996 | Whiting et al. | 341/51 |
| 5,708,511 A | * | 1/1998 | Gandhi et al. | 382/239 |
| 5,740,283 A | * | 4/1998 | Meeker | 382/248 |
| 6,031,938 A | * | 2/2000 | Kajiwara | 382/239 |
| 6,124,811 A | * | 9/2000 | Acharya et al. | 341/63 |
| 6,166,664 A | * | 12/2000 | Acharya | 341/63 |
| 6,741,368 B1 | * | 5/2004 | Hoel | 358/1.9 |

(Continued)

FOREIGN PATENT DOCUMENTS

JP  60-185468 A  9/1985

(Continued)

OTHER PUBLICATIONS

Wyle et al, "Reduced-Time Facsimile Transmission by Digital Coding", IRE Trans., vol. CS-9, No. 3, 1961).*

(Continued)

*Primary Examiner*—Yuzhen Ge
(74) *Attorney, Agent, or Firm*—Sughrue Mion, PLLC

(57) ABSTRACT

According to a data compression apparatus for compressing data such as image data, there is determined a difference between adjacent numerical values on the continuity of numerical values constituting data to be compressed. Of the numerical values appearing in the difference data, only the numerical value "YY" is encoded. There is performed such a coding that a continued number Z of the numerical value "YY" is expressed with different bit numbers in accordance with Z<128 or z≧128. In the coding, when data to be compressed is concerned with the binary data represented by only two sorts of numerical values, there is created new data to be compressed, which consists of continued numerical values represented by a unit bit number, in such a manner that the two sorts of numerical values are discriminated in one bit and the continuity of the one bit is expressed for unit bit number on a batch basis, and the created new data is transferred to the first data compression section.

20 Claims, 18 Drawing Sheets

U.S. PATENT DOCUMENTS

| | | | |
|---|---|---|---|
| 6,768,818 B2 * | 7/2004 | Friederich et al. | 382/233 |
| 6,931,159 B2 * | 8/2005 | Ridge | 382/246 |
| 7,050,639 B1 * | 5/2006 | Barnes et al. | 382/239 |
| 7,062,096 B2 * | 6/2006 | Lin et al. | 382/232 |
| 7,183,950 B2 * | 2/2007 | Sugita | 341/76 |
| 7,257,264 B2 * | 8/2007 | Nakayama et al. | 382/239 |
| 2003/0184809 A1 * | 10/2003 | Clouthier et al. | 358/3.01 |

FOREIGN PATENT DOCUMENTS

| | | |
|---|---|---|
| JP | 02-060373 | 2/1990 |
| JP | 04-250774 | 9/1992 |
| JP | 5-328142 A | 12/1993 |
| JP | 08-294142 | 11/1996 |
| JP | 9-200540 A | 7/1997 |
| JP | 10-164620 A | 6/1998 |
| JP | 11-177828 | 7/1999 |
| JP | 2000-125298 A | 4/2000 |
| JP | 2001-520822 A | 10/2001 |
| JP | 2002-152048 A | 5/2002 |
| JP | 2002-223360 | 8/2002 |
| WO | WO 98/47234 A1 | 10/1998 |

OTHER PUBLICATIONS

Wyle et al, Reduced-Time Facsimile Transmission by Digital Coding, IRE Trans., vol. CS-9, No. 3, 1961.*

* cited by examiner 01  02  02  02  03  03  03  03  04  05

PRIOR ART

| SOI | HEADER | HUFFMAN TABLE | COMPRESSED IMAGE DATA | EOI |

Fig. 14

| BEFORE CODING | AFTER CODING |
|---|---|
| A1 | 00 |
| A2 | 01 |
| A3 | 100 |
| A4 | 101 |
| A5 | 11000 |
| A6 | 11001 |
| A7 | 11101 |
| A8 | 11011 |
| A9 | 111000 |
| A10 | 111001 |
| A11 | 111010 |
| A12 | 111011 |
| A13 | 111100 |
| A14 | 111101 |
| A15 | 111110 |
| A16 | 111111 |

Fig. 15

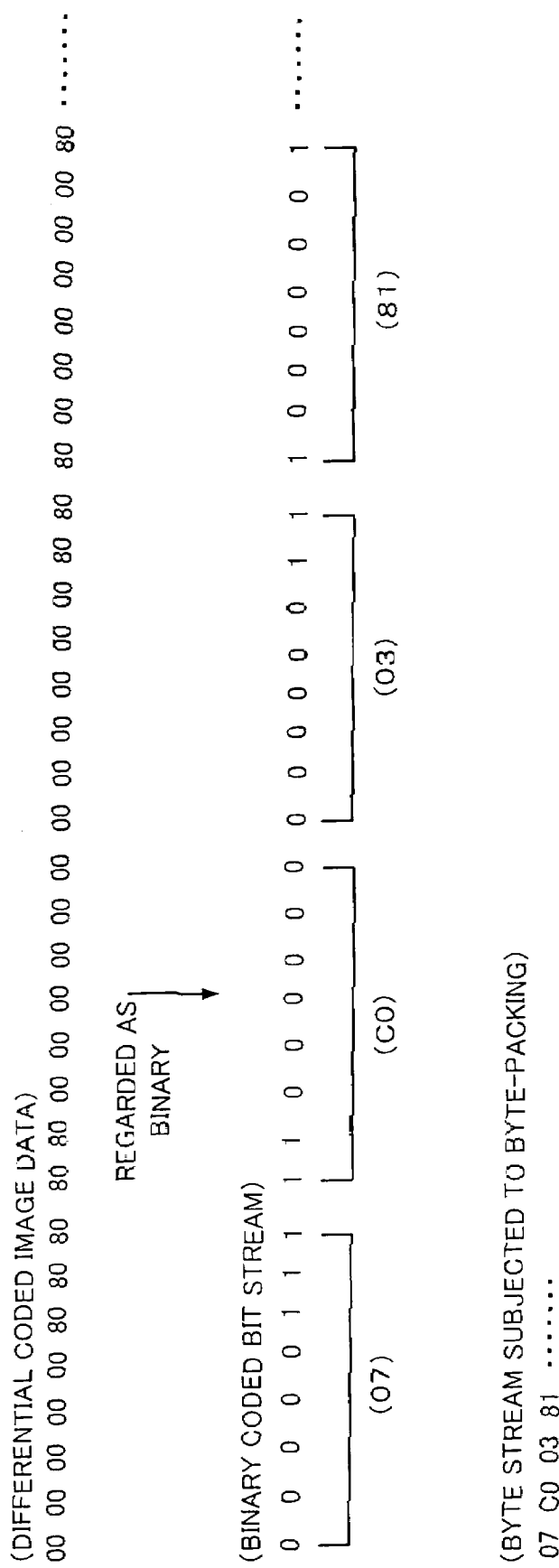

DATA COMPRESSION APPARATUS, AND DATA COMPRESSION PROGRAM STORAGE MEDIUM

BACKGROUND OF THE INVENTION

1. Field of the Invention

The present invention relates to a data compression apparatus for compressing data such as image data, and a data compression program storage medium storing a data compression program, which causes an information processing apparatus such as a computer to operate as the data compression apparatus.

2. Description of the Related Art

Hitherto, in order to reduce storage capacity or traffic, there is widely adopted a technology of compressing data such as image data.

For example, Japanese Patent Laid Open Gazette TokuKai Hei. 5-328142 discloses a technology as set forth below.

When a CLUT (color lookup table) is constructed through selection of a representative color from an original image, color numbers are allotted so that a series of color numbers has a closed value of color data, and then a bit map associated with the CLUT is created to determine a difference of color numbers between adjacent pixels. In the event that the difference takes a large value, the color number of the bit map is altered in such an extent that no deterioration of image quality occurs, so that the difference is biased to a small value, and a run length coding is applied to difference data.

Japanese Patent Laid Open Gazette TokuKai Hei. 10-164620 discloses a technology as set forth below.

Image data consisting of a plurality of data allotted to the associated colors is encoded on a non-reversible compression basis. One of the data is allotted to a transparent color, which is reversible. The image data comprises an immediate value (a first value in differential coding) and a plurality of differential values (a previous value in differential coding) subsequent to the immediate value. When those values are encoded on a non-reversible compression basis, the immediate value and the differential values representative of the transparent color are provided on a reversible basis. And the immediate value representative of the transparent color is expressed by an intermediate value of the data values for respective colors, or the differential values representative of the transparent color is expressed by "0".

Japanese Translation of PCT International Application No. 2001-520822 discloses a technology in which encoding is carried out by a difference between the predicted number (s' (j)) and the actual number (s (j)).

Japanese Patent Laid Open Gazette TokuKai Hei. 9-200540 discloses an image compression apparatus in which for Nth line of pixel data train, the state of distributions of the same pixel data in the sub-scanning direction is recognized, and the state of distributions of the same pixel data in the main scanning direction is recognized, so that it is decided in accordance with the results of those recognition whether the same pixel data continued in the sub-scanning direction are to be subjected to a compression processing, or the same pixel data continued in the main scanning direction are to be subjected to a compression processing.

Here, there will be explained a system to which a data compression technology is applied.

FIG. 1 is a view useful for understanding an example of a print system to which a data compression technology is applied. FIG. 2 is a view useful for understanding a data processing in the print system.

As shown in FIG. 1, the print system comprises a host controller 100, an interface equipment 200, and a printer 300. The host controller 100 is connected to the interface equipment 200 via an all-purpose interface cable 150 such as SCSI. And the interface equipment 200 is connected to the printer 300 via a dedicated interface cable 250.

In the host controller 100, as shown in FIG. 2, data 11 of images and characters described in various languages and formats, such as PDF, PS, TIFF, are divided into image (CT; Continuous Tone) data and characters and lines (LW; Line Work) data, and RIP (Raster Image Processing) is applied to such two types of data, so that bit map data 12A and 13A are created. Further, data compression processing is applied to such two types of data, so that non-reversible compression data 14 is created on the CT and reversible compression data 15 is created on the LW. Those types of compression data 14 and 15 are transmitted from the host controller 100 via the all-purpose interface cable 150 shown in FIG. 1 to the interface equipment 200. The interface equipment 200 applies a data expansion processing to the transmitted compression data 14 and 15 to creates bit map data 12B and 13B associated with the bit map data 12A and 13A, respectively, which are in the state before an application of the data compression processing by the host controller 100. With respect to the CT data, when the host controller 100 performs the data compression, the non-reversible compression processing is carried out. Accordingly, it is difficult to completely return the CI data after the data expansion, or the bit map data 12B to the CI data before the data compression, or the bit map data 12A. However, it is possible to reproduce the substantially same bit map data. With respect to the LW data, when the host controller 100 performs the data compression, the reversible compression processing is carried out. Accordingly, it is possible to restore the LW data after the data expansion, or the bit map data 13B to the LW data before the data compression, or the bit map data 13A.

The interface equipment 200 synthesizes the CI data after the data expansion or the bit map data 12B with the LW data after the data expansion or the bit map data 13B, and transmits the synthesized data to the printer 300 together with halftone dot information and the like in form of a tag. The printer 300 prints out an image in accordance with the bit map data received from the interface equipment 200 and the attached tag information.

In the event that there is a need that the host controller 100 and the interface equipment 200 are individually constructed in form of a separated apparatus, for example, in a case where the host controller 100 and the interface equipment 200 are mutually isolated, and in case of a system in which the interface equipment 200 receives image data from a plurality of host controllers, as shown in FIG. 2, there is provided such an arrangement that data is transferred to the interface equipment 200 through data compression by the host controller 100, so that the interface equipment 200 performs data expansion. This arrangement makes it possible to reduce a transfer time of the data from the host controller 100 to the interface equipment 200, and thereby improving the productivity of the print.

Generally, with respect to the CT data, there is adopted compression system such as JPEG, which is high in compressibility, while it is non-reversible. On the other hand, with respect to the LW data, there is adopted reversible compression system such as PackBits.

Hereinafter, for a comparison with the embodiments of the present invention, there will be described an encoding system by PackBits.

FIG. 3 is an explanatory view for a PackBits coding system.

It is assumed that "01, 02, 02, 02, 03, 03, 03, 03, 04, 05", which appear at the upper stage, denote the original data. Where there is adopted a hexadecimal notation. Of the original data, the first numerical value is "01", and the second numerical value is "02", and the third numerical value is also "02". The numerical value "02" is continued in the same numerical value. Thus, only the numerical value "01" is not continued.

Thus, there is established a numerical value "00" (the first numerical value "00" appearing at the lower stage in FIG. 3) wherein a number 1 is subtracted from the discontinuous numerical value (here "1"). Subsequently, there is established the discontinuous numerical value (here "01"), that is, the second numerical value "01" appearing at the lower stage in FIG. 3). In other words, the original data "01" is replaced by "00 01" in accordance with PackBits coding.

Next, since "02" of the original data continues by three pieces, there is established "FE" wherein a number (here 2), which is obtained through a subtraction of one from the continued number (here 3), is expressed in minus, and the negative number (here −2) is expressed by the hexadecimal notation (the third numerical value "FE" appearing at the lower stage in FIG. 3), and thereafter the continuous numerical number (here "02") itself is established (the fourth numerical value "02" appearing at the lower stage in FIG. 3). In other words, "02 02 02" of the original data is replaced by "FE 02" in accordance with PackBits coding.

Next, since "03" of the original data continues by four pieces, in a similar fashion as mentioned above, there is established "FD" wherein a number (here 3), which is obtained through a subtraction of one from the continued number (here 4), is expressed in minus, and the negative number (here −3) is expressed by the hexadecimal notation, and thereafter the continuous numerical number (here "03") itself is established. In other words, "03 03 03 03" of the original data is replaced by "FD 03" in accordance with PackBits coding.

Further, thereafter, "04 05" of the original data continue. However, those numerical numbers "04" and "05" do not continue in the same number. Thus, there is established a numerical value "01", which is obtained through a subtraction of one from a number (here 2) of the discontinuous numerical values ("04", "05"), and then the discontinued numerical values itself "04 05" are established. In other words, "04 05" of the original data is replaced by "01 04 05" in accordance with PackBits coding.

In PackBits, the coding is performed in accordance with the above-mentioned rule.

In case of the PackBits coding, the number, which is capable of being established as the continuous number of the same numerical value, is −1 to −127. That is, the number, which is capable of being expressed in form of the continuous number, is up to 128. This number is expressed by 2 bytes (8 bits×2), and thus the maximum bulk compressibility is $^2\!/_{128}\!=\!^1\!/_{64}$ on a principle basis.

However, for example, in case of the LW data, it often happens that the same numerical values are continued, for instance, the continued blank, and this brings about a problem that the maximum bulk compressibility 1/64 is inefficient.

As seen from FIG. 3, the original data "01" is encoded into "00 01", and the original data "04 05" is encoded into "01 04 05". In those cases, the encoded data is more redundant than the original data.

While the explanation of FIG. 3 is concerned with multiple-valued data, such as "01", "02", "03", "04", "05", . . . , the LW data is often concerned with binary data, for example, in case of the LW data representative of an image consisting of only characters each having the same density on a white background for instance.

SUMMARY OF THE INVENTION

In view of the foregoing, it is an object of the present invention to provide a data compression apparatus capable of performing a data compression processing improving a bulk compressibility, and a data compression program storage medium storing a data compression program, which causes an information processing apparatus such as a computer to operate as the data compression apparatus capable of performing a data compression processing improving a bulk compressibility.

To achieve the above-mentioned object, the present invention provides a data compression apparatus that applies a data compression processing to data to be compressed, the data consisting of continued numerical values represented by a predetermined number of unit bits, the data compression apparatus having a first data compression section comprising:

a numerical detection section that detects the existence of one or a plurality of compression subject numerical values from among the data to be compressed and the number of continuities of the same compression subject numerical values; and a coding section that provides such a coding processing that of the data to be compressed, numerical values except compression subject numerical values are directly outputted, and the compression subject numerical values are coded into the compression subject numerical values and numerical value representative of the number of continuities of the same compression subject numerical values as the compression subject numerical values, and then outputted.

In the data compression apparatus according to the present invention as mentioned above, it is preferable that the coding section performs a coding to express the number of continuities of the same compression subject numerical values with the different bit number in accordance with the number of continuities of the same compression subject numerical values.

In the data compression apparatus according to the present invention as mentioned above, it is acceptable that the coding section performs such a coding that when the number of continuities of the same compression subject numerical values is not more than a predetermined number, the number of continuities is expressed with one-unit bit number, and when the number of continuities of the same compression subject numerical values is more than the predetermined number, the number of continuities is expressed with two-unit bit number.

In the data compression apparatus according to the present invention as mentioned above, it is preferable that before the first data compression section, there is disposed a second data compression section that performs such a processing that there is determined a difference between adjacent numerical values on the continuity of numerical values constituting the data to be compressed so as to create data consisting of the continued numerical values representative of the difference, and the created data is transferred to the first data compression section.

In the data compression apparatus according to the present invention as mentioned above, it is preferable that the second coding section performs such a processing that the numerical value of the head in each of distinctions, wherein the continuity of the numerical values constituting the entered data is sequentially divided, is outputted directly, and with respect to the numerical values other than the numerical value of the head, there is outputted the numerical value represented by lower order of unit bits of the difference between adjacent numerical values.

In the data compression apparatus according to the present invention as mentioned above, it is preferable that after the first data compression section, there is disposed a third data compression section that applies an entropy coding to the data which is subjected to the coding by the first data compression section.

In the data compression apparatus according to the present invention as mentioned above, it preferable that the data compression apparatus further comprises a fourth compression section that provide such a processing that in a case where data to be compressed is concerned with the binary data represented by only two sorts of numerical values, there is created new data to be compressed, which consists of continued numerical values represented by a unit bit number, in such a manner that the two sorts of numerical values are discriminated in one bit and the continuity of the one bit is expressed for unit bit number on a batch basis, and the created new data is transferred to the first data compression section.

In the data compression apparatus according to the present invention as mentioned above, it is preferable that before the first data compression section and the fourth data compression section, there is disposed a fifth data compression section that performs a processing in which differences between the adjacent numerical values on the continuity of the numerical values constituting the data to be compressed are determined so as to create data consisting of a series of numerical values representative of the differences.

In the data compression apparatus according to the present invention as mentioned above, it is referable that the fifth data compression section performs such a processing that the numerical value of the head in each of distinctions, wherein the continuity of the numerical values constituting the entered data is sequentially divided, is outputted directly, and with respect to the numerical values other than the numerical value of the head, there is outputted the numerical value represented by lower order of unit bits of the difference between adjacent numerical values.

In the data compression apparatus according to the present invention as mentioned above, it is preferable that the fifth data compression section performs such a processing that when the data to be compressed is concerned with the binary data, two sorts of numerical values constituting the binary data are discriminated with 00 and 80 hexadecimally, and the difference is determined on the data to be compressed, which consists of the continuity of 00 and 80, so that there is created a new data to be compressed, which consists of continued numerical values representative of the difference.

In the data compression apparatus according to the present invention as mentioned above, it is preferable that the data compression apparatus further comprises a data sort discriminating section that discriminates whether the data to be compressed is the binary data including only two sorts of numerical values or a multiple-valued data including numerical values not less than three sorts.

To achieve the above-mentioned object, the present invention provides a data compression program storage medium storing a data compression program, which causes an information processing apparatus to operate as a data compression apparatus that applies a data compression processing to data to be compressed, the data consisting of continued numerical values represented by a predetermined number of unit bits, the data compression apparatus having a first data compression section comprising:

a numerical detection section that detects the existence of one or a plurality of compression subject numerical values from among the data to be compressed and the number of continuities of the same compression subject numerical values; and a coding section that provides such a coding processing that of the data to be compressed, numerical values except compression subject numerical values are directly outputted, and the compression subject numerical values are coded into the compression subject numerical values and numerical value representative of the number of continuities of the same compression subject numerical values as the compression subject numerical values, and then outputted.

In the data compression program storage medium storing a data compression program according to the present invention as mentioned above, it is preferable that the coding section performs a coding to express the number of continuities of the same compression subject numerical values with the different bit number in accordance with the number of continuities of the same compression subject numerical values.

In the data compression program storage medium storing a data compression program according to the present invention as mentioned above, it is acceptable that the coding section performs such a coding that when the number of continuities of the same compression subject numerical values is not more than a predetermined number, the number of continuities is expressed with one-unit bit number, and when the number of continuities of the same compression subject numerical values is more than the predetermined number, the number of continuities is expressed with two-unit bit number.

In the data compression program storage medium storing a data compression program according to the present invention as mentioned above, it is preferable that before the first data compression section, there is disposed a second data compression section that performs such a processing that there is determined a difference between adjacent numerical values on the continuity of numerical values constituting the data to be compressed so as to create data consisting of the continued numerical values representative of the difference, and the created data is transferred to the first data compression section.

In the data compression program storage medium storing a data compression program according to the present invention as mentioned above, it is preferable that the second coding section performs such a processing that the numerical value of the head in each of distinctions, wherein the continuity of the numerical values constituting the entered data is sequentially divided, is outputted directly, and with respect to the numerical values other than the numerical value of the head, there is outputted the numerical value represented by lower order of unit bits of the difference between adjacent numerical values.

In the data compression program storage medium storing a data compression program according to the present invention as mentioned above, it is preferable that after the first data compression section, there is disposed a third data compression section that applies an entropy coding to the data which is subjected to the coding by the first data compression section.

In the data compression program storage medium storing a data compression program according to the present invention as mentioned above, it is preferable that the data compression apparatus further comprises a fourth compression section that provide such a processing that in a case where data to be compressed is concerned with the binary data represented by only two sorts of numerical values, there is created new data to be compressed, which consists of continued numerical values represented by a unit bit number, in such a manner that the two sorts of numerical values are discriminated in one bit and the continuity of the one bit is expressed for unit bit number on a batch basis, and the created new data is transferred to the first data compression section.

In the data compression program storage medium storing a data compression program according to the present invention as mentioned above, it is preferable that before the first data compression section and the fourth data compression section, there is disposed a fifth data compression section that performs a processing in which differences between the adjacent numerical values on the continuity of the numerical values constituting the data to be compressed are determined so as to create data consisting of a series of numerical values representative of the differences.

In the data compression program storage medium storing a data compression program according to the present invention as mentioned above, it is preferable that the fifth data compression section performs such a processing that the numerical value of the head in each of distinctions, wherein the continuity of the numerical values constituting the entered data is sequentially divided, is outputted directly, and with respect to the numerical values other than the numerical value of the head, there is outputted the numerical value represented by lower order of unit bits of the difference between adjacent numerical values.

In the data compression program storage medium storing a data compression program according to the present invention as mentioned above, it is preferable that the fifth data compression section performs such a processing that when the data to be compressed is concerned with the binary data, two sorts of numerical values constituting the binary data are discriminated with 00 and 80 hexadecimally, and the difference is determined on the data to be compressed, which consists of the continuity of 00 and 80, so that there is created a new data to be compressed, which consists of continued numerical values representative of the difference.

In the data compression program storage medium storing a data compression program according to the present invention as mentioned above, it is preferable that the data compression apparatus further comprises a data sort discriminating section that discriminates whether the data to be compressed is the binary data including only two sorts of numerical values or a multiple-valued data including numerical values not less than three sorts.

BRIEF DESCRIPTION OF THE DRAWINGS

FIG. 3 is an explanatory view for a PackBits coding system.

FIG. 14 is a view useful for understanding an example of a data format of image data outputted from the data compression apparatus shown in FIG. 4.

FIG. 15 is a view useful for understanding an example of the Huffman table.

FIG. 19 is an explanatory view useful for understanding a binary coding processing in the binary coding section shown in FIG. 16.

DETAILED DESCRIPTION OF PREFERRED EMBODIMENTS

Embodiments of the present invention will be described with reference to the accompanying drawings.

Figure 1:
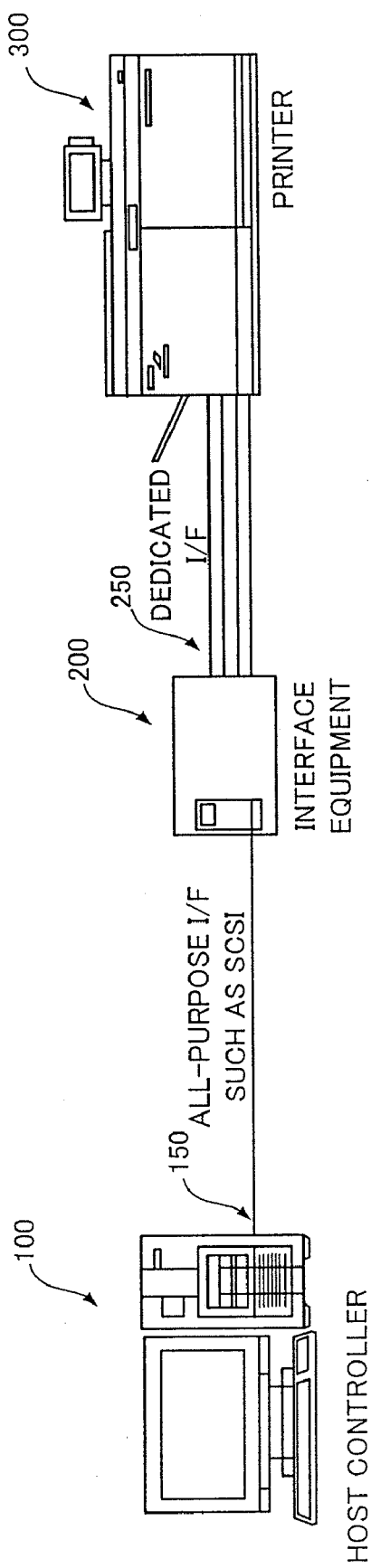
FIG. 1 is a view useful for understanding an example of a print system to which a data compression technology is applied.

The embodiments of the present invention relate to a data compression apparatus that is to be incorporated into the host controller 100 of the overall system shown in FIG. 1. More specifically, the data compression apparatus performs a data compression for bit map data 13A (FIG. 2) of LW in the host controller. Accordingly, it is understood that the data compression processing and the data expansion processing on the LW data, which were explained referring to FIG. 1 and FIG. 2, are replaced by the embodiments of the present invention, which will be explained herein after, and thus the redundant explanations on the overall system shown in FIG. 1 and the flow of the processing shown in FIG. 2 will be omitted.

Figure 4:
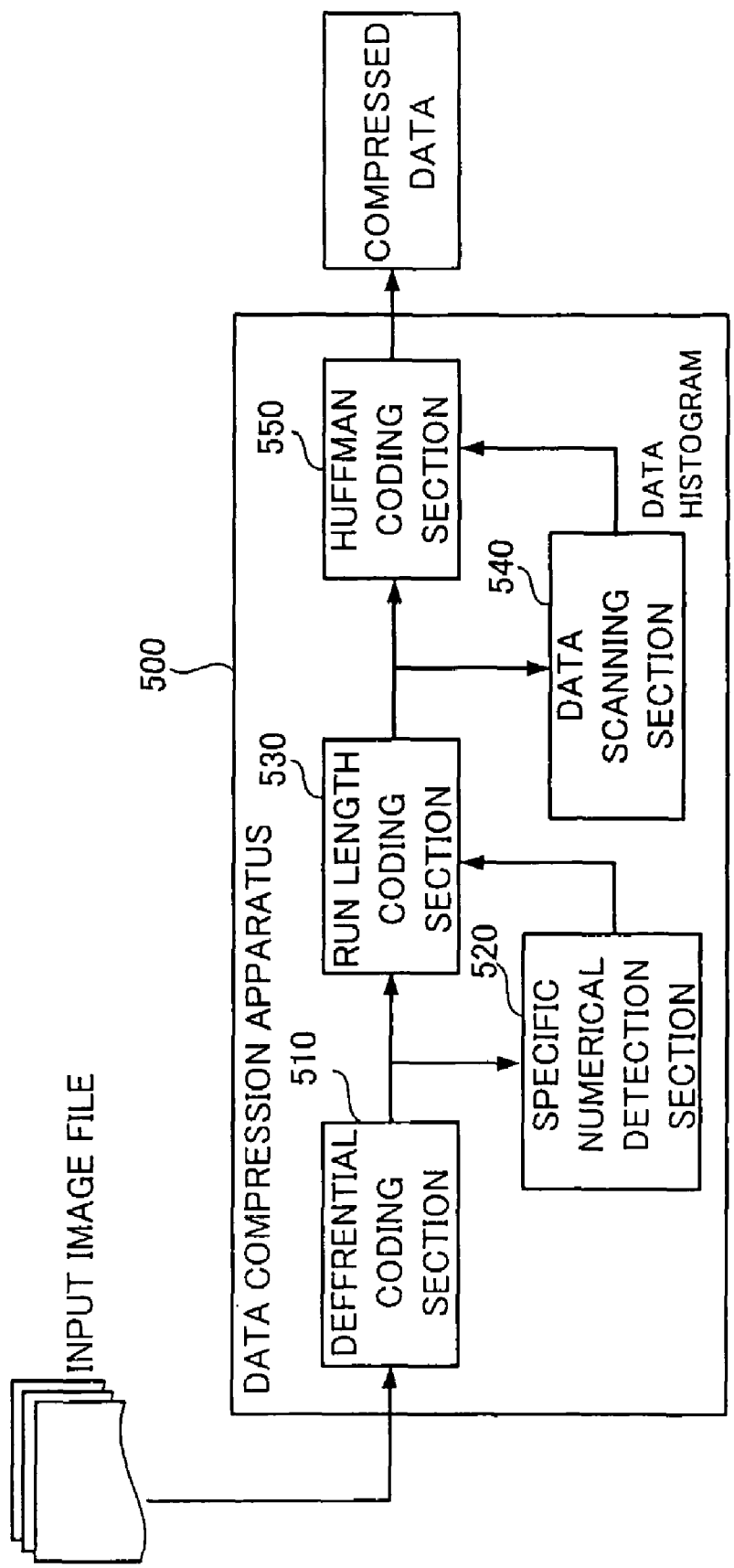
FIG. 4 is a block diagram of a first embodiment of a data compression apparatus of the present invention.

FIG. 4 is a block diagram of a first embodiment of a data compression apparatus of the present invention.

A data compression apparatus 500 shown in FIG. 4 comprises a differential coding section 510, a specific numerical detection section 520, a run length coding section 530, a data scanning section 540, and a Huffman coding section 550. Details of the respective sections will be described later. Hereinafter, a flow of image data in the data compression apparatus 500 will be described.

Figure 2:
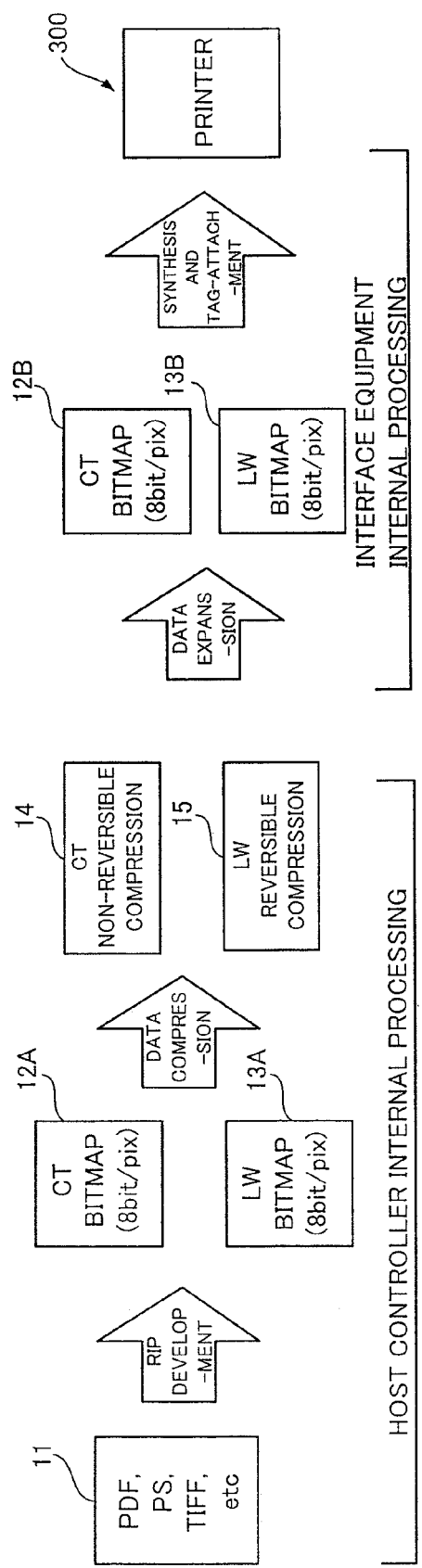
FIG. 2 is a view useful for understanding a data processing in the print system.

An input image data (according to the present embodiment, it corresponds to a file storing the LW data 13A, which is developed into a bit map, as shown in FIG. 2), is inputted to the differential coding section 510 of the data compression apparatus 500 shown in FIG. 4 to perform the differential coding processing, that is, such a processing that there is determined a difference between adjacent numerical values on the continuity of numerical values constituting entered data so as to create image data consisting of the continued numerical values representative of the difference. The differential coding section 510 corresponds to an example of the second data compression section referred to in the present invention. More specifically, the differential coding section 510 performs such a processing that the numerical value of the head in each of distinctions, wherein the continuity of the numerical values constituting the entered data is sequentially divided, is outputted directly, and with respect to the numerical values other than the numerical value of the head, there is outputted the numerical value represented by lower order of unit bits of the difference between adjacent numerical values.

The data, which is subjected to the differential coding by the differential coding section 510, is fed to both the specific numerical detection section 520 and the run length coding section 530. The specific numerical detection section 520 detects the existence of one or a plurality of compression subject numerical values from among the entered data and the number of continuities of the same compression subject numerical values. The run length coding section 530 receives a detection result by the specific numerical detection section 520 and provides such a coding processing that of the data entered from the differential coding section 510, numerical values except compression subject numerical values are directly outputted, and the compression subject numerical values are coded into the compression subject numerical values and numerical value representative of the number of continuities of the same compression subject numerical values as the compression subject numerical values, and then outputted. In the coding processing as mentioned above, the run length coding section 530 performs a coding to express the number of continuities of the same compression subject numerical values with the different bit number in accordance with the number of continuities of the same compression subject numerical values. Specifically, according to the present embodiment, there is performed such a coding that when the number of continuities of the same compression subject numerical values is not more than a predetermined number, the number of continuities is expressed with one-unit bit number, and when the number of continuities of the same compression subject numerical values is more than the predetermined number, the number of continuities is expressed with two-unit bit number. According to the present embodiment, a combination of the specific numerical detection section 520 with the run length coding section 530 corresponds to the first data compression section referred to in the present invention, which is an important inventive feature of the present invention.

The data, which is subjected to the coding in the run length coding section 530, is fed to both the data scanning section 540 and the Huffman coding section 550. The data scanning section 540 performs scanning all of the data coded in the run length coding section 530 to determine frequency of occurrence (histogram) of all of the numerical values appearing in the data. According to the present embodiment, the data, which is determined in frequency of occurrence (histogram), is treated in unit of each of the input image files shown in FIG. 4, and the data scanning section 540 determines frequency of occurrence (histogram) of the numerical values appearing in the data coded in the run length coding section 530, of each of the input image files. The data histogram (frequency of occurrence of the numerical values), which is determined in the data scanning section 540, is fed to the Huffman coding section 550. The Huffman coding section 550 performs a coding processing in which numerical values constituting the data entered to the Huffman coding section 550 are replaced by values represented by a bit length that is shorter with the higher frequency of occurrence (histogram) of numerical values, in accordance with a rule of Huffman coding.

The Huffman coding is a sort of the entropy coding. According to the present embodiment, a combination of the data scanning section 540 with the Huffman coding section 550 corresponds to the third data compression section referred to in the present invention.

The data, which is subjected to the Huffman coding in the Huffman coding section 550, is transmitted via the an all-purpose interface cable 150 such as SCSI, as shown in FIG. 1, to the interface equipment 200 together with an assignment table of the numerical values of the input data to the Huffman coding section 550 and the values after the Huffman coding, which is set up in accordance with the data histogram determined in the data scanning section 540, in form of the LW reversible compression data 15. The interface equipment 200 applies a data expansion processing to the received LW reversible compression data 15. In the data expansion processing, first, there is performed a decoding processing for the coding processing carried out in the Huffman coding section 550 shown in FIG. 4, and next, there is performed a decoding processing for the coding processing carried out in the run length coding section 530 shown in FIG. 4, and finally, there is performed a decoding processing for the coding processing carried out in the differential coding section 510 shown in FIG. 4, so that the same image data as the image data in the original input file is restored to the original state.

Figure 5:
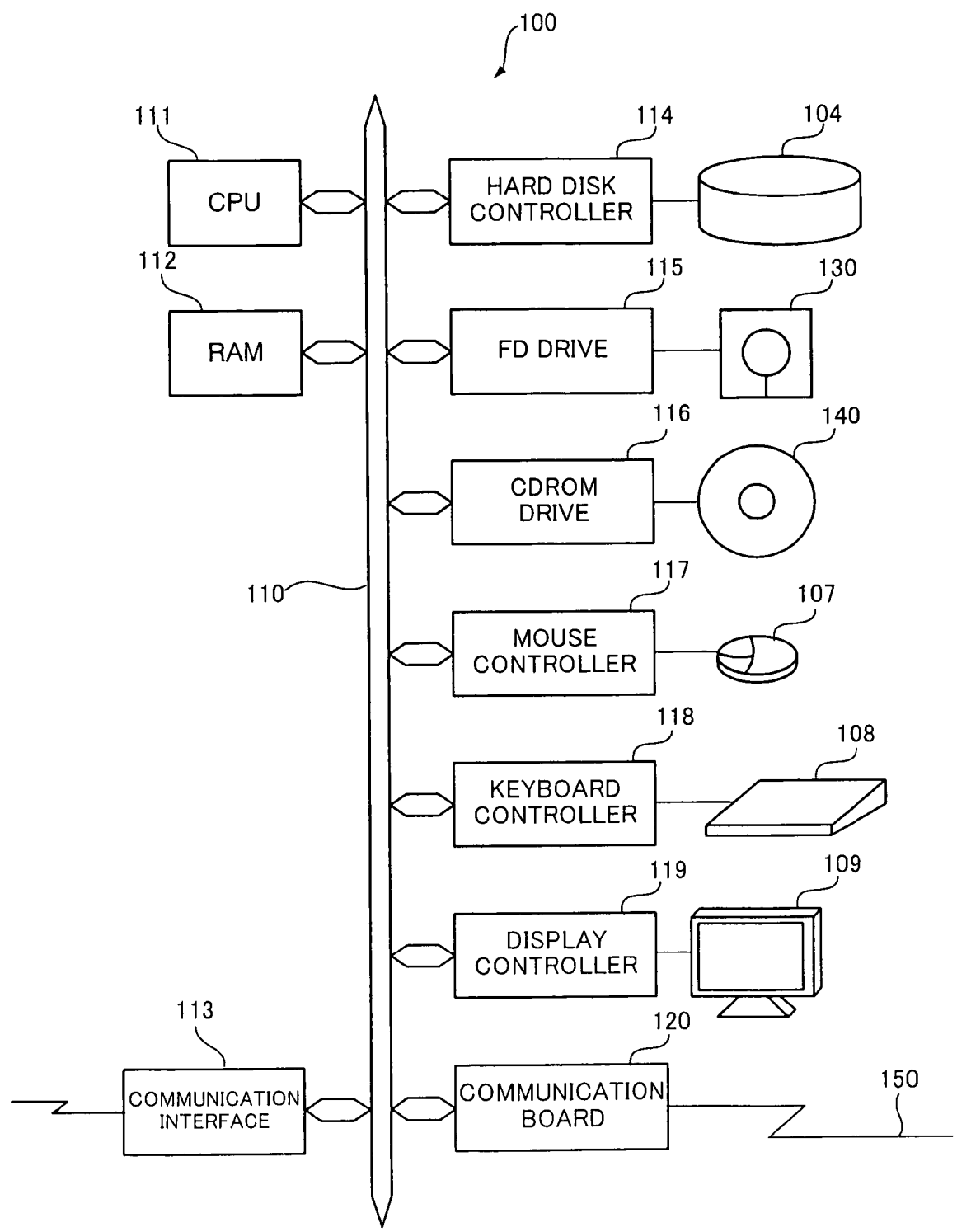
FIG. 5 is a hardware structural view of the host controller shown in FIG. 1.

FIG. 5 is a hardware structural view of the host controller shown in FIG. 1.

A host controller 100 shown in FIG. 1 may be constructed of a computer system of the structure shown in FIG. 5.

The host controller 100, which is constructed of the computer system shown in FIG. 5, comprises a CPU 111, a RAM 112, a communication interface 113, a hard disk controller 114, a flexible disk (FD) drive 115, a CD-ROM drive 116, a mouse controller 117, a keyboard controller 118, a display controller 119, and a communication board 120. These various types of elements are connected via a bus 110 to one another.

The hard disk controller 114 controls an access of a hard disk 104 that is incorporated in the host controller 100. The FD drive 115 and the CD-ROM drive 116 control an access of a flexible disk (FD) 130 and a CD-ROM 140, which are detachably mounted on the host controller 100, respectively. The mouse controller 117 and the keyboard controller 118 serve to detect operations of a mouse 107 and a keyboard 108, respectively, so that a result of the detection is transmitted to the CPU 111. The display controller 119 causes an image to be displayed on a display screen of a display 109 of the host controller 100 in accordance with the instruction of the CPU 111.

The communication board 120 has a function of a communication based on an all-purpose interface protocol such as SCSI, and serves to transmit the compressed image data via the interface cable 150 to the interface equipment 200.

The communication interface 113 serves to perform a communication via all-purpose network such as Internet. The host controller 100 receives image data via the communication interface 113.

The RAM 112 reads a program stored in the hard disk 104 to develop the program for the purpose of execution by the CPU 111. The CPU 111 reads the program developed in the RAM 112 and executes the same.

Figure 6:
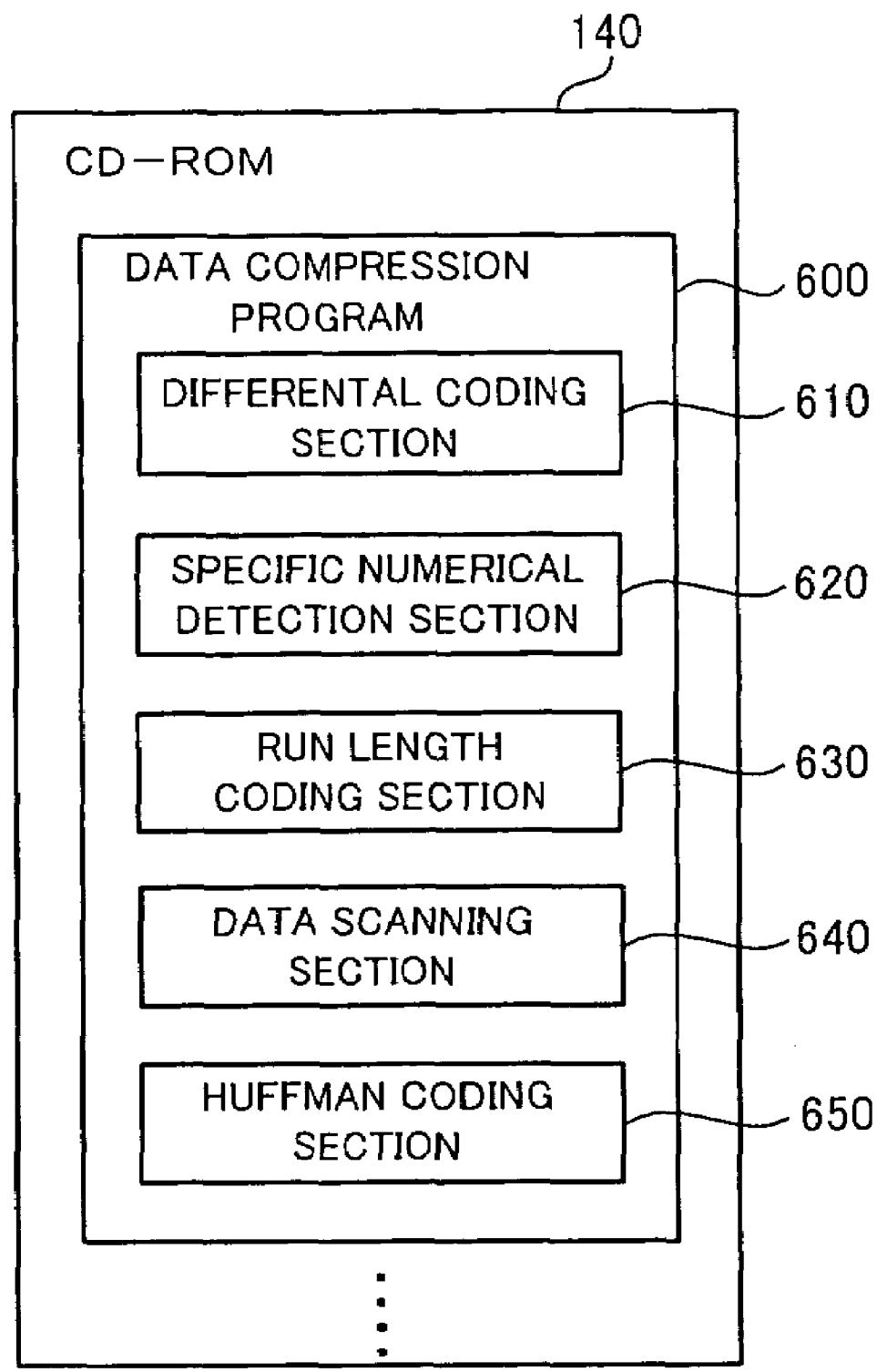
FIG. 6 is a typical structural view of a data compression program stored in a data compression program storage medium of the present invention.

FIG. 6 is a typical structural view of a data compression program stored in a data compression program storage medium of the present invention.

A data compression program 600 is stored in the CD-ROM 140.

The data compression program 600 comprises a differential coding section 610, a specific numerical detection section 620, a run length coding section 630, a data scanning section 640, and a Huffman coding section 650. The CD-ROM 140 stores therein various sorts of programs for executing a series of processing shown in FIG. 2 in the host controller 100 shown in FIG. 1, as well as the data compression program 600. Those programs are the same as the conventional one, and thus the redundant explanation will be omitted.

When the CD-ROM 140 shown in FIG. 6 is mounted on the host controller 100 shown in FIG. 5 so as to be accessed by the CD-ROM drive 116, the data compression program 600 stored in the CD-ROM 140 is up-loaded on the host controller 100 and is stored in the hard disk 104. Thus, the data compression program stored in the hard disk 104 is read from the hard disk 104 and is developed in the RAM 112. When the CPU 111 executes the developed data compression program, the host controller 100 operates as an apparatus for executing various sorts of processing as the host controller shown in FIG. 2, including processing as the data compression apparatus 500 shown in FIG. 4.

Here, when the data compression program 600 shown in FIG. 6 is installed in the host controller 100 and is executed in the CPU 111, the data compression program 600 implements the data compression apparatus 500 shown in FIG. 4 in the host controller 100. When the CPU 111 executes the differential coding section 610, the specific numerical detection section 620, the run length coding section 630, the data scanning section 640, and the Huffman coding section 650, those sections serve as program parts that cause the host controller 100 to operate as the differential coding section 510, the specific numerical detection section 520, the run length coding section 530, the data scanning section 540, and the Huffman coding section 550, respectively, which constitute the data compression apparatus 500 shown in FIG. 4. Functions of the sections 610 to 650 that constitute the data compression program 600 shown in FIG. 6, wherein those sections 610 to 650 are executed in the CPU 111, are the completely same as functions of the sections 510 to 550 that constitute the data compression apparatus 500 shown in FIG. 4, respectively. Accordingly, the above-mentioned explanation as to the data compression apparatus 500 shown in FIG. 4 and the detailed explanation, which will be described later, may serve as the explanation for the sections 610 to 650 that constitute the data compression program 600 shown in FIG. 6.

Figure 7:
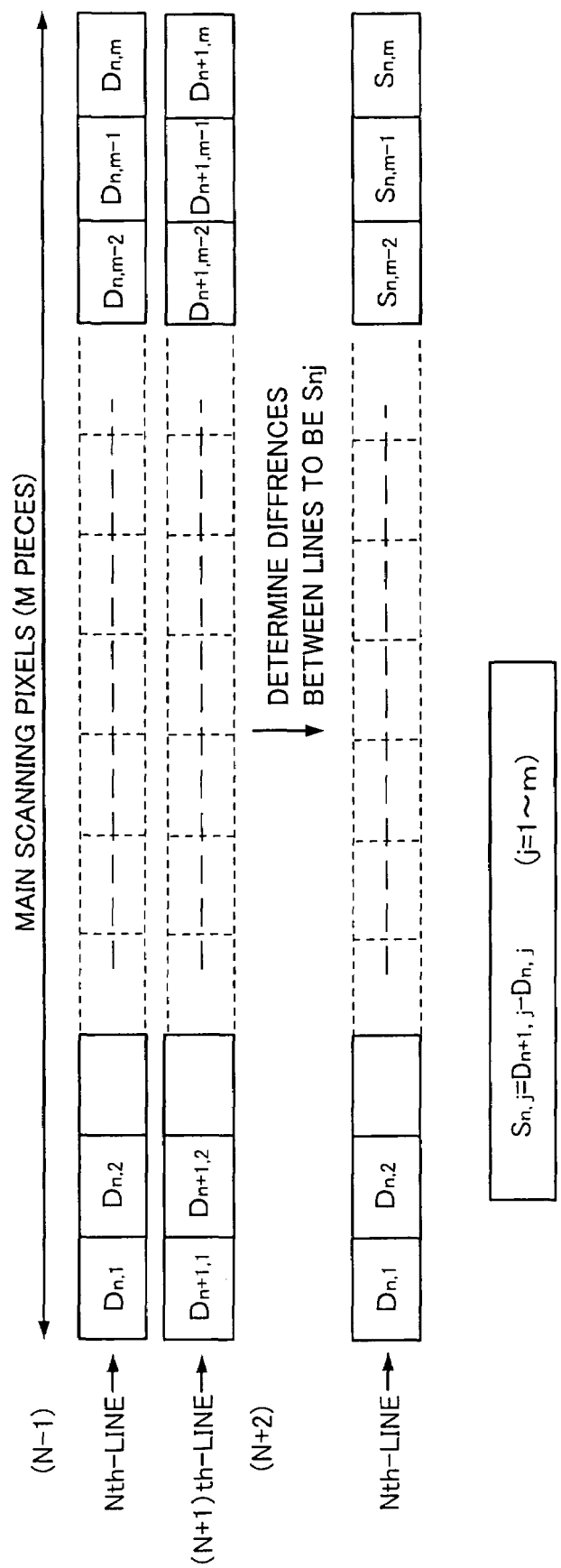
FIG. 7 is a view useful for understanding a data structure of image data of an input image file to be entered into the data compression apparatus shown in FIG. 4 and a concept of the differential coding.

FIG. 7 is a view useful for understanding a data structure of image data of an input image file to be entered into the data compression apparatus shown in FIG. 4 and a concept of the differential coding.

As shown in FIG. 7, the image data, which is to be entered to the data compression apparatus 500 shown in FIG. 4, consists of M pieces of pixels arranged in a predetermined main scanning direction. On the Nth line in the sub-scanning direction perpendicular to the main scanning direction, the pixel values of the pixels arranged in the main scanning direction are expressed, in the order of the arrangement, as set forth below.

$$D_{n,1}, D_{n,2}, \ldots, D_{n,m-2}, D_{n,m-1}, D_{n,m}$$

In a similar fashion, on the (N+1)th line in the sub-scanning direction, the pixel values of the pixels arranged in the main scanning direction are expressed, in the order of the arrangement, as set forth below.

$$D_{n+1,1}, D_{n+1,2}, \ldots, D_{n+1,m-2}, D_{n+1,m-1}, D_{n+1,m}$$

The differential coding section 510 of the data compression apparatus 500 shown in FIG. 4 receives the image data as mentioned above and determines the differences between the adjacent pixels. That is, the difference $S_{n,j}$ is expressed as follows.

$$S_{n,j} = D_{n+1,j} - D_{n,j} \quad (j=1 \sim m)$$

Where $S_{n,j}$ denotes a difference between the Nth line and the (N+1)th line, and also the difference of the j-th pixel arranged in the main scanning direction.

Hereinafter, the differential operation will be explained in details.

Figure 8:
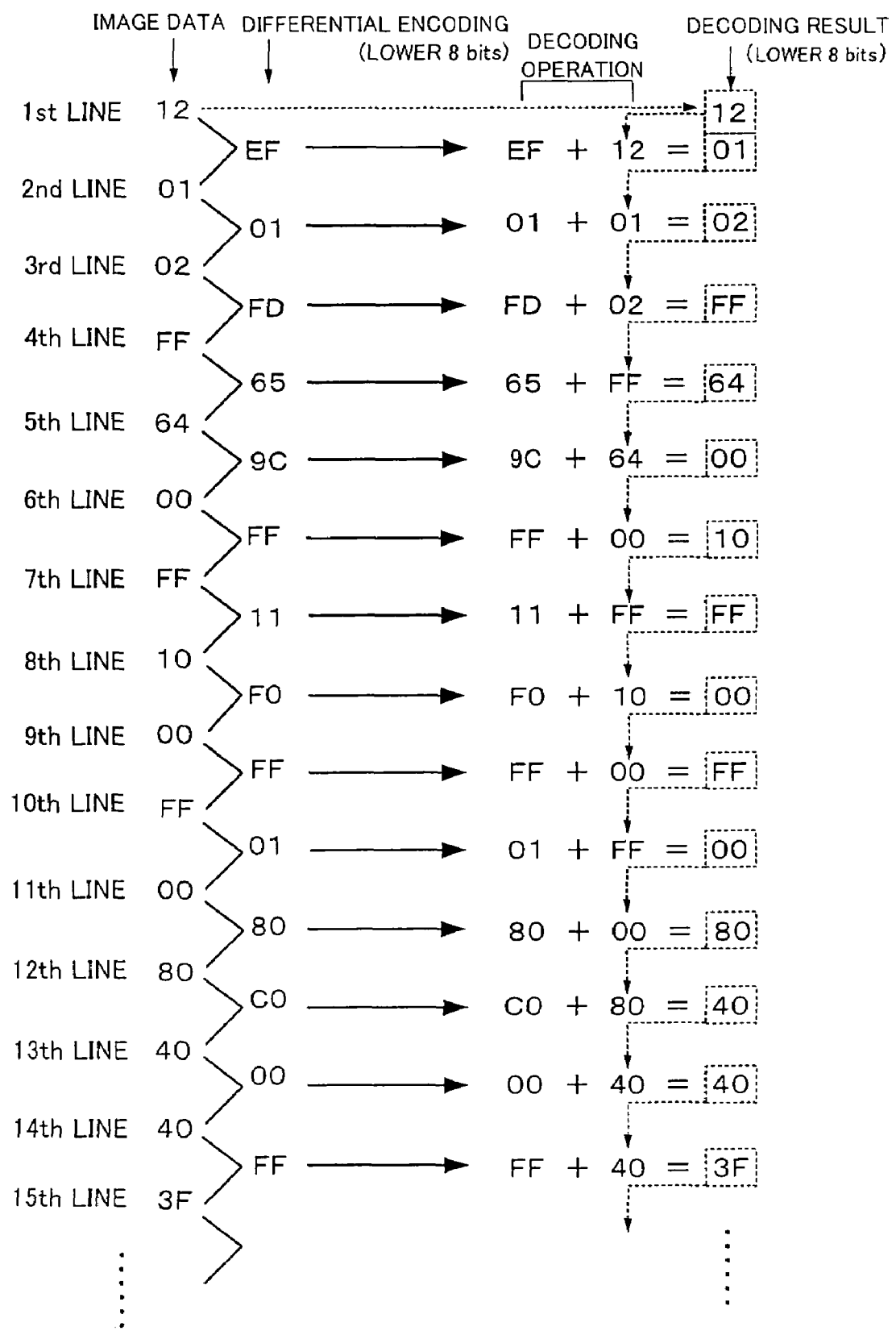
FIG. 8 is a view useful for understanding an example of a differential coding processing in the differential coding section constituting the data compression apparatus shown in FIG. 4.

FIG. 8 is a view useful for understanding an example of a differential coding processing in the differential coding section 510 constituting the data compression apparatus 500 shown in FIG. 4.

It is assumed that the pixel values on the vertical line in the sub-scanning direction shown in FIG. 7 are expressed, as shown in the column of "IMAGE DATA" in FIG. 8, as set forth below.

"12 01 02 FF 64 . . . 40 40 3F . . . "

where the pixel values are expressed by hexadecimal two digit (1 byte=8 bits). It is noted that the "line" denotes the pixels arranged in the main scanning direction.

First, with respect to the first line of pixel value "12", it is outputted directly.

Next, the first line of pixel value "12" is subtracted from the second line of pixel value "01" to output a result. The result of the subtraction of "12" from "01" is a negative number. This negative number is expressed by "1EF" in 9 bits. Here, however, "1", which is 1 bit in the MSB (Most Significant Bit), is omitted, and only "EF", which is 8 bits in the lower order of unit bit, is outputted.

Next, the second line of pixel value "01" is subtracted from the third line of pixel value "02", and a value "01" of a result is outputted.

Next, the third line of pixel value "02" is subtracted from the fourth line of pixel value "FF", and a value "FD" of a result is outputted.

Next, the fourth line of pixel value "FF" is subtracted from the fifth line of pixel value "64", and "1", which is 1 bit in the MSB, is omitted, and only "65", which is 8 bits in the lower order of unit bit, is outputted.

This operation is repeated to output data appearing in the column of "DIFFERENTIAL ENCODING (LOWER 8 bits)" in FIG. 8, as set forth below.

"(12) EF 01 FD 65 . . . C0 00 FF . . . "

To decode the differential encoded data as mentioned above, the interface equipment 200 shown in FIG. 1 performs an operation as shown in the right side of FIG. 8.

First, the first line of pixel value "12" is left as it is.

With respect to the second line of pixel value, the first line of pixel value "12" is added to the differential value "EF" to obtain a result. Thus, the second line of pixel value is "01", which is expressed with 8 bits in the lower order of unit bit, of the result.

With respect to the third line of pixel value, the second line of pixel value "01" is added to the differential value "01" to obtain a result. Thus, the third line of pixel value is "02", which is obtained through the result by the addition.

With respect to the forth line of pixel value, the third line of pixel value "02" is added to the differential value "FD" to obtain a result. Thus, the forth line of pixel value is "FF", which is obtained through the result by the addition.

With respect to the fifth line of pixel value, the fourth line of pixel value "FF" is added to the differential value "65" to obtain a result. Thus, the fifth line of pixel value is "64", which is expressed with 8 bits in the lower order of unit bit, of the result.

Hereinafter, this operation is repeated to decode the differential encoded data to the data before the differential encoding.

According to the present embodiment, the operation as explained referring to FIG. 8 is performed in such a manner that the pixel values of the pixels arranged in the first line in the main scanning direction are established as the numerical value of the head in the operation. In other words, according to the present embodiment, a line of pixels arranged in the sub-scanning direction is treated as "partition wherein the continuity of numerical values constituting entered data is sequentially partitioned" referred to in the present invention, and the first line of pixel values is treated as "first numerical value for each partition".

According to the present embodiment, a line of pixels arranged in the sub-scanning direction is established as one partition. However, as to the unit of the partition it is the optional matter. That is, it is acceptable that a line of pixels arranged in the sub-scanning direction is partitioned, for example, into a plurality of blocks, or alternatively, it is acceptable that a plurality of lines of pixels arranged in the sub-scanning direction is established as one partition.

Figure 9:
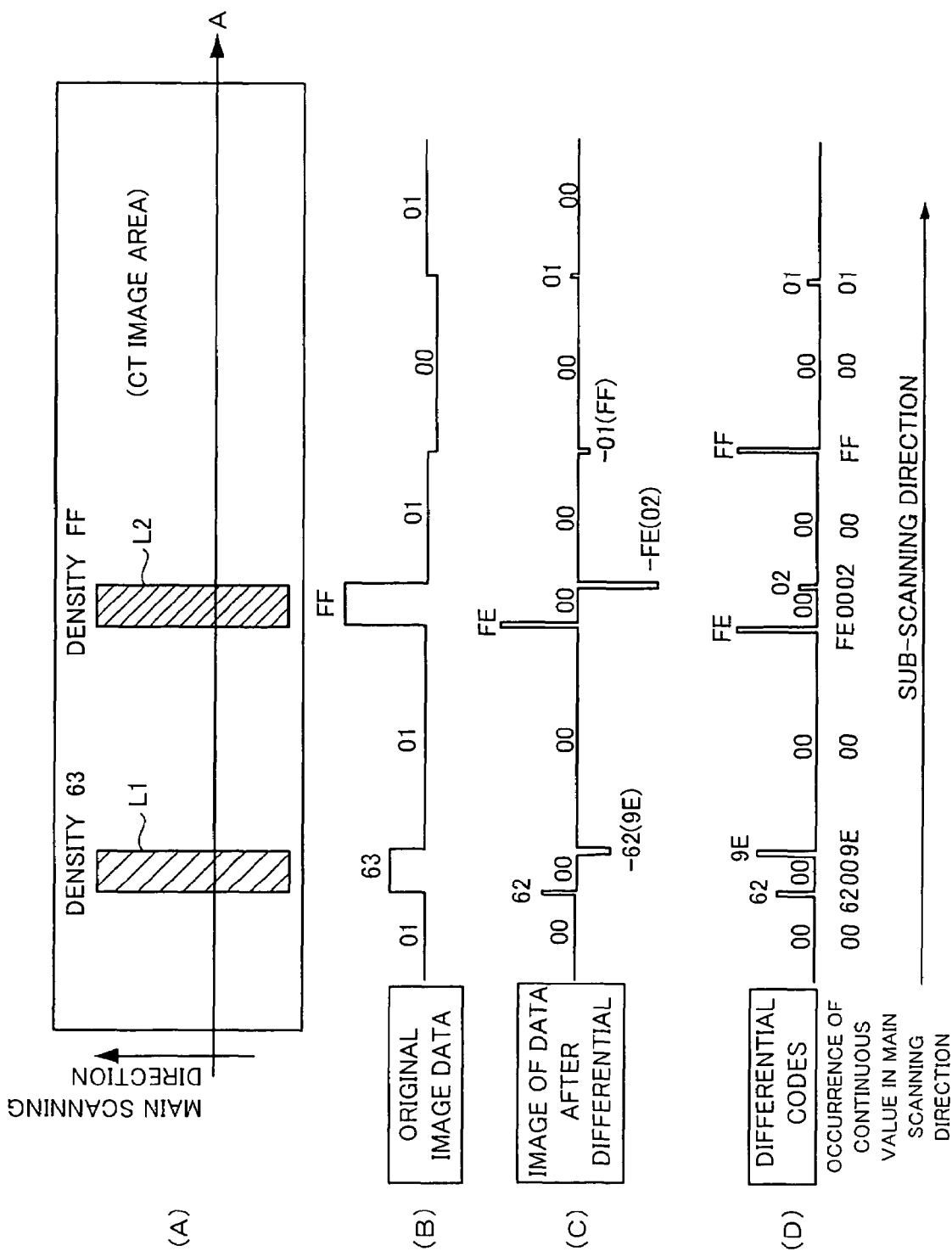
FIG. 9 is an explanatory view useful for understanding functions according to the differential coding.

FIG. 9 is an explanatory view useful for understanding functions according to the differential coding.

A part (A) of FIG. 9 is useful for understanding the concept of an image, where the vertical direction of the figure denotes the main scanning direction, and the horizontal direction of the figure denotes the sub-scanning direction. Here, there is paid attention to pixel values of pixels on an arrow A drawn in the sub-scanning direction.

On the image there are drawn a straight line L1. having density of the pixel value "63" extending in the main scanning direction and a straight line L2 having density of the pixel value "FF". And at the right side there exists a CT image area to which a CT image is applied. The CT image area, to which the CT image is applied, is expressed by the pixel value "00".

The pixel values of the pixels arranged on the arrow A in the part (A) of FIG. 9 take, as shown in a part (B) of FIG. 9, in order from the left, "01", "63" on the straight line L1, "01", "FF" on the straight line L2, "01", "00" on the CT image area to which the CT image is applied, and "01" on an area out of the CT image area. The pixel value "01" denotes an area in which nothing is drawn, that is, an area of a background of a sheet.

When a differential operation is performed for the original image data shown in the part (B) of FIG. 9, the original image data is expressed by data after differential as shown in a part (C) of FIG. 9, and a probability of occurrence of "00" is greatly increased. According to the differential coding section 510 in FIG. 4, as explained in FIG. 8, one bit (a sign bit) of MSB is omitted, and thus the data outputted from the differential coding section 510 is expressed as shown in a part (D) of FIG. 9. Even in this case, as explained referring to FIG. 8, a direct transmission of the first pixel value (the first line of pixel value "12" in case of FIG. 1) makes it possible to sequentially restore the original data.

The data, which is subjected to the differential coding processing by the differential coding section 510 shown in FIG. 4, is fed to both the specific numerical detection section 520 and the run length coding section 530.

The run length coding section 530 performs the coding processing only for the specific numerical values of a plurality of numerical values constituting the data received from the differential coding section 510. On the other hand, the specific numerical detection section 520 detects the numerical values to be subjected to the coding processing in the run length coding section 530 (the numerical values are referred to as "compression subject numerical value") from among the data received from the differential coding section 510, and the continued number of the compression subject numerical value.

According to the present embodiment, the specific numerical detection section 520 shown in FIG. 4 may designate, by way of example, three numerical values of "01", "FF" and "00" as the compression subject numerical value.

It is considered that the background of the LW image and the like is often concerned with "1" which is representative of a color of a background of a sheet per se. And thus according to the present embodiment, the numerical value "1" may be designated as one of the compression subject numerical values.

The numerical value "FF" is a value representative of the maximum density. A portion of a character of the LW image is not always concerned with the numerical value "FF". However, it is sure that the frequency of occurrence of the numerical value "FF" is relatively high. And thus according to the present embodiment, the numerical value "FF" may also be designated as one of the compression subject numerical values.

The numerical value "00" of the LW image is a value for instructing a selection of the CT data but not the LW data in the synthesis and tag-attachment processing in the interface equipment internal processing shown in FIG. 2. In case of an image in which both the LW image and the CI image exist in the image that is finally printed by the printer 300 shown in FIG. 1, the frequency of occurrence of the numerical value "00" in the LW data is also high. And thus according to the present embodiment, the numerical value "00" may also be designated as one of the compression subject numerical values.

According to the present embodiment, three numerical values of "01", "FF" and "00" may be designated as the compression subject numerical values by the reason as mentioned above. However, it is acceptable that the numerical values of "FD" and "02" may also be designated as the compression subject numerical values by the reason as set forth below.

According to the embodiment of the present invention as shown in FIG. 4, the differential coding section 510 is disposed before the run length coding section 530 with respect to the stream of data. Thus, the differences between three numerical values of "01", "FF" and "00", which are high in the frequency of occurrence, are determined as follows, except for the sign bit.

$FF-00=FF$ $00-FF=01$ $01-00=01$ $01-01=FF$ $FF-01=FE$ $02-FF=02$

Of those six differential values, the values of "FF" and "01" are raised as the compression subject numerical values by the reason as mentioned above. And thus it is acceptable that the remaining values of "FE" and "02" are added as the compression subject numerical values so that five numerical values of "01", "FF", "00", "FE" and "02" may be designated as the compression subject numerical values.

However, according to the present embodiment, there will be continued the explanation assuming that the three numerical values of "01", "FF" and "00" may be designated as the compression subject numerical values.

Figure 10:
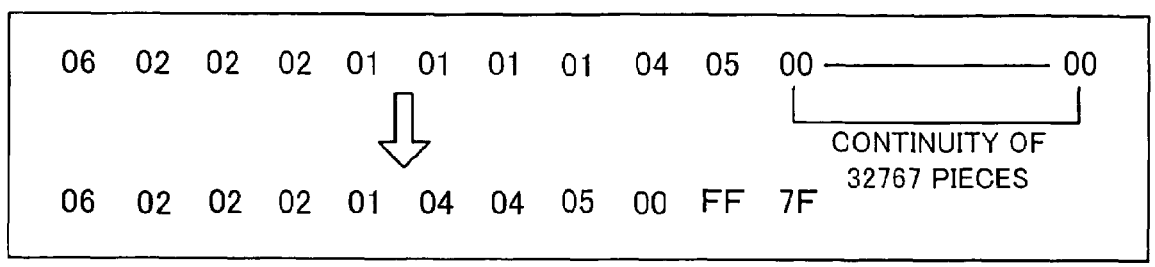
FIG. 10 is an explanatory view useful for understanding coding in the run length coding section shown in FIG. 4.

FIG. 10 is an explanatory view useful for understanding coding in the run length coding section 530 shown in FIG. 4. The upper line in FIG. 10 is concerned with data received from the differential coding section 510, and the lower line is concerned with data subjected to the coding processing by the run length coding section 530.

Here, as shown in the upper line of FIG. 10, it is assumed that the following data is received from the differential coding section 510.

"06 02 02 02 01 01 01 01 04 05 00 . . . "

In this case, the specific numerical detection section 520 in FIG. 4 detects that the first numerical value "06" is not the compression subject numerical value, the successive numerical value "02 02 02" is also not the compression subject numerical value, the compression subject numerical values "01" continuously occur four times, and the compression subject numerical values "00" continuously occur 32767 times interposing the numerical values "04" and "05", which are not the compression subject numerical values. This information is transmitted to the run length coding section 530 in FIG. 4.

Figure 11:
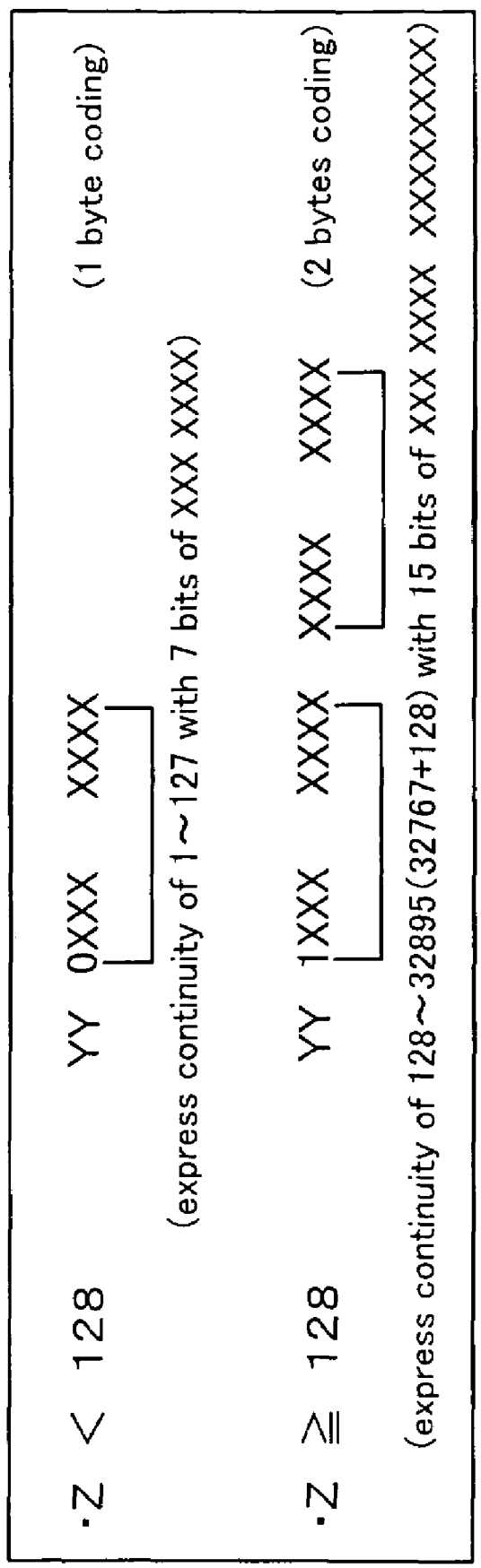
FIG. 11 is a view useful for understanding algorithm of coding for compression subject numerical values in the run length coding section.

FIG. 11 is a view useful for understanding algorithm of coding for compression subject numerical values in the run length coding section.

In FIG. 11, Z denotes a continued number of the same compression subject numerical value, for example, with respect to "01" on the upper line in FIG. 10, Z=4, and with respect to "00", Z=32767.

In FIG. 11, "YY" denotes the compression subject numerical value expressed by the hexadecimal two digit per se. "0" or "1" subsequent to "YY" denote "0" or "1" expressed with 1 bit, respectively. "XX . . . " denotes the value of Z, where one "X" represents 1 bit.

More in detail, in FIG. 11, in the event that the compression subject numerical value "YY" continues Z<128, the compression subject numerical value "YY" is expressed with the first one byte, the first bit is expressed by "0" with the subsequent one byte, and the value of Z is expressed with the subsequent 7 bits. And in the event that the compression subject numerical value "YY" continues z≧128, the compression subject numerical value "YY" is expressed with the first one byte, the first bit of the subsequent 2 bytes (16 bits) is expressed by "1", so that the coding is expressed with 2 bytes, and the value of Z is expressed with the subsequent 15 bits.

Hereinafter, there will be explained an example of the coding shown in FIG. 10 in accordance with the rule shown in FIG. 11.

Since the first numerical value "06", which constitutes the data (on the upper line) received from the differential coding section 510 in FIG. 4, is not the compression subject numerical value, the value "06" is directly outputted. Further, since the subsequent numerical values "02 02 02" are also not the compression subject numerical value, those three values "02" are also directly outputted. Next, since four pieces of compression subject numerical value "01" continue, the values are coded into "01 04". Since the subsequent numerical values "04 05" are not the compression subject numerical value, those values "04" and "05" are directly outputted.

Next, since 32767 pieces of numerical value "00" continue, "00" is established, and the first one bit of the next one byte is expressed by "1" and 32767-128 is expressed with 15 bits, so that three bytes of "00 FF 7F" express that 32767 pieces of "00" continue. That is, the continued number 128 is expressed with "00 00", except for the first bit "1".

Figure 12:
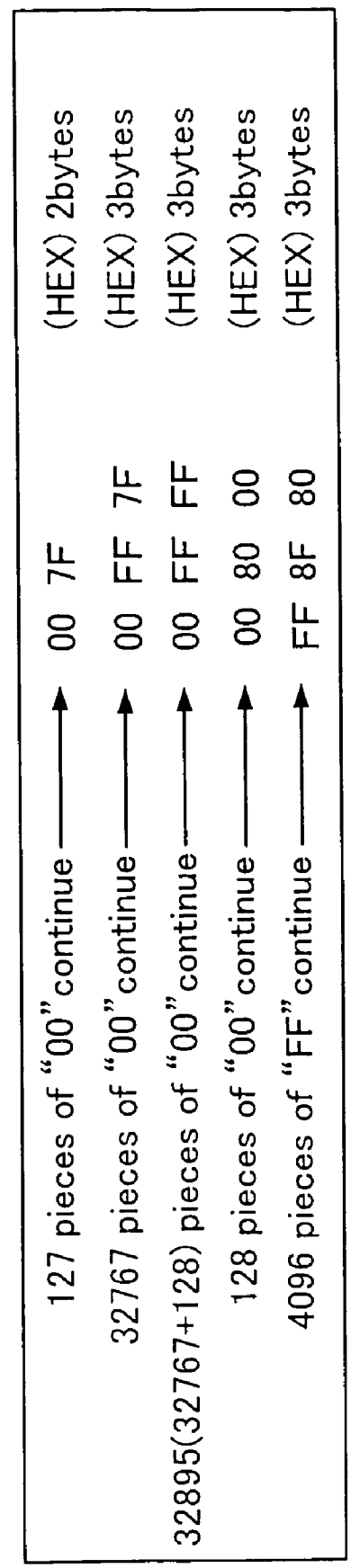
FIG. 12 is an explanatory view useful for understanding an example of the coding processing according to the continued number in the run length coding section shown in FIG. 4.

FIG. 12 is an explanatory view useful for understanding an example of the coding processing according to the continued number in the run length coding section 530 shown in FIG. 4.

When 127 pieces of "00" continue, the use of 2 bytes encodes data to "00 7E".

When 32767 pieces of "00" continue, the use of 3 bytes encodes data to "00 FF 7E".

When 32895 pieces of "00" continue, the use of 3 bytes encodes data to "00 FF FF".

When 128 pieces of "00" continue, the use of 3 bytes encodes data to "00 80 00".

When 4096 pieces of "FF" continue, the use of 3 bytes encodes data to "FF 8F 80".

The run length coding section 530 shown in FIG. 4 performs the coding processing as mentioned above.

In this case, since the numerical values other than the compression subject numerical values are directly outputted, it is possible to avoid the problem of redundancy involved in the PackBits coding as explained referring to FIG. 3. Further, according to the PackBits coding as explained referring to FIG. 3, the maximum bulk compressibility is 1/64. On the other hand, according to the run length coding section 530 of the present embodiment, the maximum bulk compressibility is improved to 3/32895=1/10965.

The data, which is subjected to the coding processing in the run length coding section 530 in FIG. 4, is fed to the data scanning section 540 and the Huffman coding section 550.

The data scanning section 540 determines frequency of occurrence of the pixel value on pixels constituting a sheet of LW image in its entirety, and transmits the order of the frequency of occurrence of the pixel value to the Huffman coding section 550.

Here, the frequency of occurrence of the pixel value "A1" is highest, and "A2", "A3", "A4" . . . are higher in the named order. Incidentally, "A1" "A2", "A3", "A4" . . . do not represent directly the numerical value, and are codes each representative of the numerical value. That is, "A1" denotes, for example, the numerical value "00", and "A2" denotes, for example, the numerical value "FF". Further, according to the present embodiment, for the purpose of simplification, it is assumed that all pixels of data, which is transmitted from the run length coding section 530 in FIG. 4, are represented by anyone of 16 pieces of numerical values "A1" to "A16".

Figure 13:
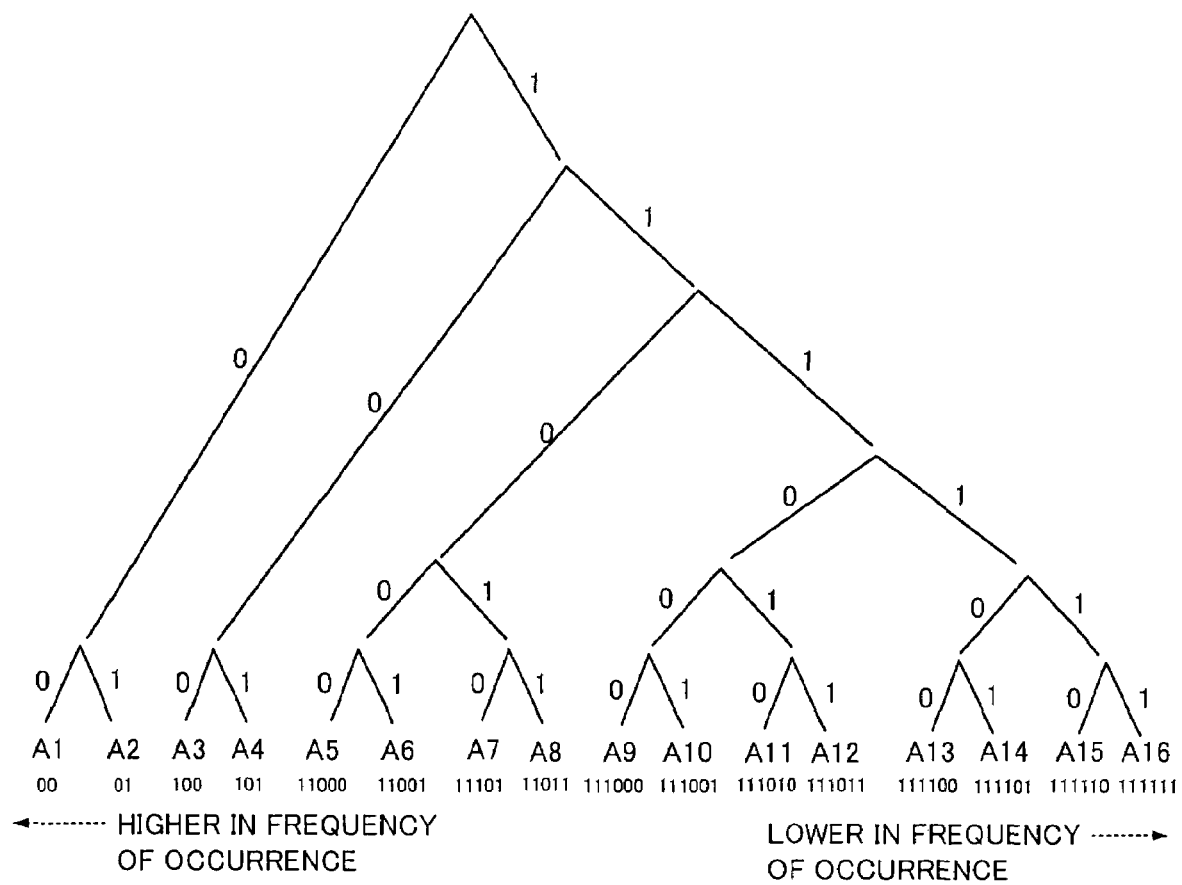
FIG. 13 is an explanatory view useful for understanding an example of the coding processing in the Huffman coding section shown in FIG. 4.

FIG. 13 is an explanatory view useful for understanding an example of the coding processing in the Huffman coding section 550 shown in FIG. 4.

Here, "A1", which is highest in frequency of occurrence, is replaced by "00" expressed with 2 bits. "A2" is replaced by "01" expressed with 2 bits. "A3" and "A4" are replaced by "100" and "101", respectively, which are expressed with 3 bits. And "A5" to "A8" are replaced by the associated numerical values, respectively, which are expressed with 5 bits. Hereinafter, in a similar fashion, the lower numerical values in frequency of occurrence are replaced by the associated numerical values with the more number of bits, respectively.

FIG. 14 is a view useful for understanding an example of a data format of image data outputted from the data compression apparatus 500 shown in FIG. 4.

First, there is placed a code SOI (Start Of Image) which is representative of a head of an image data file, and next there is placed a header in which information such as sizes of images is recorded, and thereafter there is placed the Huffman table which is used in encoding in the Huffman coding section 550 in FIG. 4.

FIG. 15 is a view useful for understanding an example of the Huffman table.

The Huffman table is harmonized with FIG. 13. That is, the Huffman table is a table that indicates an association between numerical values before coding (before replacement) and numerical values after coding (after replacement) so that data is replaced by numerical values expressed with the shorter number of bits, the higher the frequency of occurrence is concerned.

The interface equipment 200 shown in FIG. 1 performs a decoding to the Huffman coding referring to the Huffman table.

As shown in FIG. 14, image data after Huffman encoding follows behind the Huffman table, and finally a code of EOI (End Of Image) is placed.

The data compression apparatus 500 shown in FIG. 4 transmits the image data file arranged in format as shown in FIG. 14 to the interface equipment 200 shown in FIG. 1. The interface equipment 200 performs the decoding in the order reversed to the encoding as explained above to carry out a data expansion, so that the encoded data is restored to the same image data as the image data in the input image file before the input to the data compression apparatus 500 shown in FIG. 4.

The data compression apparatus 500 shown in FIG. 4 is provided with the differential coding section 510. The provision of the differential coding section 510 makes it possible to increase the frequency of occurrence of the numerical value "00", as mentioned above. Thus, the use of the differential coding section 510 is preferable, but it is not always necessary for the present invention. It is acceptable that the input data is fed directly to the specific numerical detection section 520 and the run length coding section 530 shown in FIG. 4, without performing the differential coding processing for the input data. Alternatively, it is acceptable that the differential coding section 510 is replaced by another coding section for performing a data compression processing.

According to the data compression apparatus 500 shown in FIG. 4, the Huffman coding section 550 is disposed after the run length coding section 530, so that the Huffman coding processing is applied to the data subjected to encoding by the run length coding section 530. However, it is not always necessary that the Huffman coding processing is applied to the data subjected to encoding by the run length coding section 530. It is acceptable that the Huffman coding processing is replaced by another entropy coding processing. Alternatively, it is acceptable that the data, which is subjected to encoding by the run length coding section 530, is directly outputted from the data compression apparatus 500.

Further, according to the above-mentioned embodiment, it is concerned with an example in which the present invention is applied to LW data. It is noted, however, that the present invention is not restricted to one in which the subject of the data compression is concerned with only the LW data, and it is possible to expect a satisfactory data compression also when the present invention is applied, in case of some images, to the CT data and image data in which the LW data and the CT data are mixed.

Next, there will be explained a second embodiment.

The second embodiment is similar to the first embodiment as mentioned above and relates to a data compression apparatus to be incorporated into the host controller 100 in the overall system shown in FIG. 1, and particularly, relates to the processing for carrying out the data compression on the LW bit map data 13A in the host controller shown in FIG. 2. Accordingly, it is understood that the data compression processing and the data expansion processing for the LW data, which are explained referring to FIG. 1 and FIG. 2, may be replaced with processing as the second embodiment of the present invention, which will be explained hereinafter, and the redundant explanation will be omitted with respect to the overall system shown in FIG. 1 and the process of the processing shown in FIG. 2.

Figure 16:
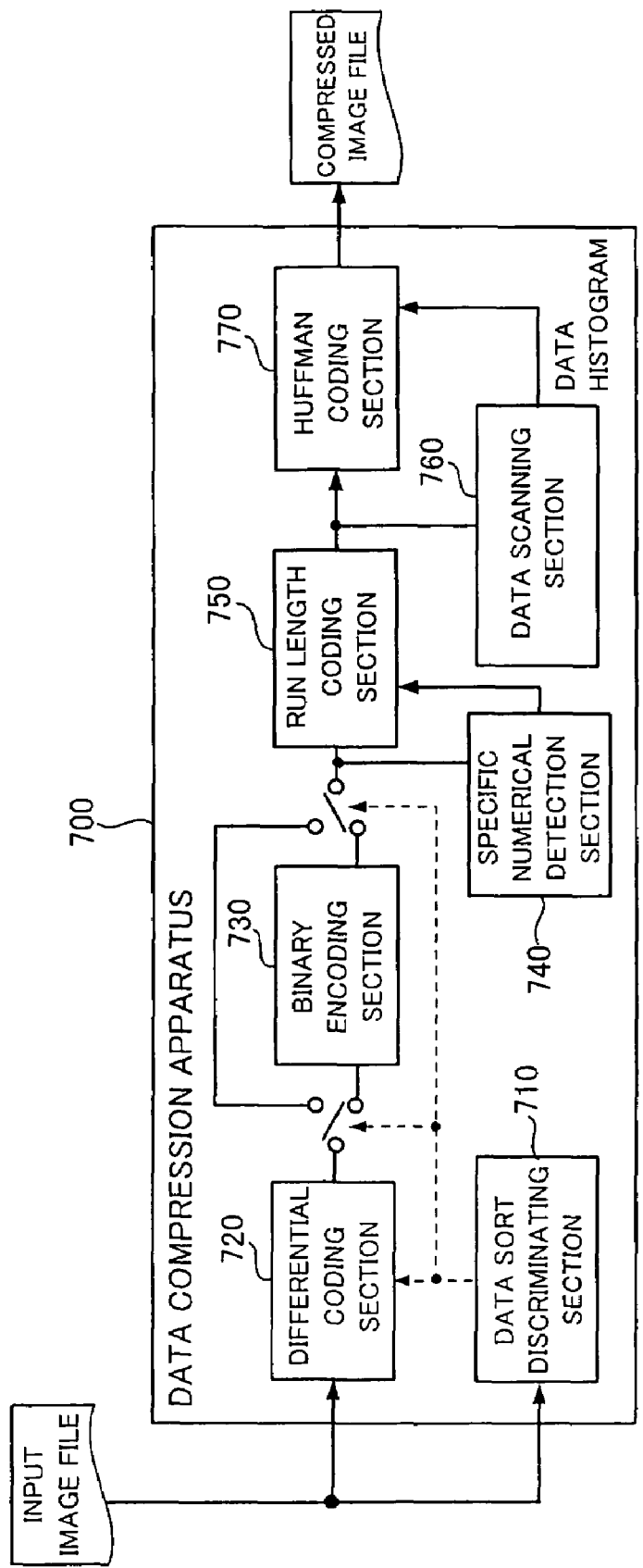
FIG. 16 is a block diagram of a second embodiment of a data compression apparatus of the present invention.

FIG. 16 is a block diagram of the second embodiment of a data compression apparatus of the present invention.

A data compression apparatus 700 shown in FIG. 16 comprises a data sort discriminating section 710, a differential coding section 720, a binary encoding section 730, a specific numerical detection section 740, a run length coding section 750, a data scanning section 760, and a Huffman coding section 770. A data flow of image data in the data compression apparatus 700 is as follows.

An input image file (according to the present embodiment, as shown in FIG. 2, it is a file storing LW data 13A developed into the bit map) is fed to the data sort discriminating section 710 and the differential coding section 720, of the data compression apparatus 700 shown in FIG. 16. The data sort discriminating section 710 discriminates whether the image data of the input image file now received is the binary data or the multiple-valued (not less than three-valued) data. To determine the sort of the data, the data sort discriminating section 710 sequentially searches numerical values constituting the image data of the input image file now received, and decides that it is the multiple-valued data when third sort of numerical values is detected in the image data, and decides that it is the binary data when only two sorts of numerical values are finally detected in the image data.

A decision result is transmitted to the differential coding section 720, and the destination of an output data of the differential coding section 720 is switched in accordance with the decision result in such a manner that when it is the binary data, the output data of the differential coding section 720 is fed to the binary encoding section 730 to perform the binary encoding (which will be described later), and when it is the multiple-valued data, the output data of the differential coding section 720 is fed to the specific numerical detection section 740 and the run length coding section 750 without being subjected to the binary encoding processing by the binary encoding section 730.

The differential coding section 720 performs the differential coding processing for the received input image file, that is, performs the processing in which differences between the adjacent numerical values on the continuity of the numerical values constituting the input data are determined so as to create data consisting of a series of numerical values representative of the differences. The differential coding section 720 corresponds to an example of the fifth data compression section referred to in the present invention. More in details, the differential coding section 720 performs such a processing that the numerical value of the head in each of distinctions, wherein the continuity of the numerical values constituting the entered data is sequentially divided, is outputted directly, and with respect to the numerical values other than the numerical value of the head, there is outputted the numerical value represented by lower order of unit bits of the difference between adjacent numerical values. With respect to the binary data, the differential coding section 720 discriminates the binary values constituting the binary data with 00 and 80 hexadecimally, and performs the differential operation regarding the data as the data to be compressed consisting of a series of 00 and 80. Details of the differential operation will be described later.

The data, which is subjected to the differential coding by the differential coding section 720, is fed to both the specific numerical detection section 740 and the run length coding section 750. But with respect to the binary data, the data is subjected to the binary coding processing by the binary encoding section 730, and then be fed to the specific numerical detection section 740 and the run length coding section 750. The specific numerical detection section 740 detects the existence of one or a plurality of compression subject numerical values from among the entered data and the number of continuities of the same compression subject numerical values. The run length coding section 750 receives a detection result by the specific numerical detection section 740 and provides such a coding processing that of the data entered from the differential coding section 720, numerical values except compression subject numerical values are directly outputted, and the compression subject numerical values are coded into the compression subject numerical values and numerical value representative of the number of continuities of the same compression subject numerical values as the compression subject numerical values, and then outputted. In the coding processing as mentioned above, the run length coding section 750 performs a coding to express the number of continuities of the same compression subject numerical values with the different bit number in accordance with the number of continuities of the same compression subject numerical values. Specifically, according to the present embodiment, there is performed such a coding that when the number of continuities of the same compression subject numerical values is not more than a predetermined number, the number of continuities is expressed with one-unit bit number, and when the number of continuities of the same compression subject numerical values is more than the predetermined number, the number of continuities is expressed with two-unit bit number. According to the present embodiment, a combination of the specific numerical detection section 740 with the run length coding section 750 corresponds to the first data compression section referred to in the present invention, which is an important inventive feature of the present invention.

The data, which is subjected to the coding in the run length coding section 750, is fed to both the data scanning section 760 and the Huffman coding section 770. The data scanning section 760 performs scanning all of the data coded in the run length coding section 750 to determine frequency of occurrence (histogram) of all of the numerical values appearing in the data. According to the present embodiment, the data, which is determined in frequency of occurrence (histogram), is treated in unit of each of the input image files shown in FIG. 16, and the data scanning section 760 determines frequency of occurrence (histogram) of the numerical values appearing in the data coded in the run length coding section 750, of each of the input image files. The data histogram (frequency of occurrence of the numerical values), which is determined in the data scanning section 760, is fed to the Huffman coding section 770. The Huffman coding section 770 performs a coding processing in which numerical values constituting the data entered to the Huffman coding section 770 are replaced by values represented by a bit length that is shorter with the higher frequency of occurrence (histogram) of numerical values, in accordance with a rule of Huffman coding.

The Huffman coding is a sort of the entropy coding. According to the present embodiment, a combination of the data scanning section 760 with the Huffman coding section 770 corresponds to the third data compression section referred to in the present invention.

The data, which is subjected to the Huffman coding in the Huffman coding section 770, is transmitted via the an all-purpose interface cable 150 such as SCSI, as shown in FIG. 1, to the interface equipment 200 together with an assignment table of the numerical values of the input data to the Huffman coding section 770 and the values after the Huffman coding, which is set up in accordance with the data histogram determined in the data scanning section 760, and information necessary for the data expansion, in form of a compression image file storing the LW reversible compression data 15. The interface equipment 200 applies a data expansion processing to the received LW reversible compression data 15. In the data expansion processing, first, there is performed a decoding processing for the coding processing carried out in the Huffman coding section 770 shown in FIG. 16, and next, there is performed a decoding processing for the coding processing carried out in the run length coding section 750 shown in FIG. 16, and finally, there is performed a decoding processing for the coding processing carried out in the differential coding section 720 shown in FIG. 16, so that the same image data as the image data in the original input file is restored to the original state. But with respect to the binary data, there is performed a decoding processing for the coding processing carried out in the binary encoding section 730 shown in FIG. 16, and then there is performed the decoding processing for the coding processing carried out in the differential coding section 720 shown in FIG. 16.

Figure 17:
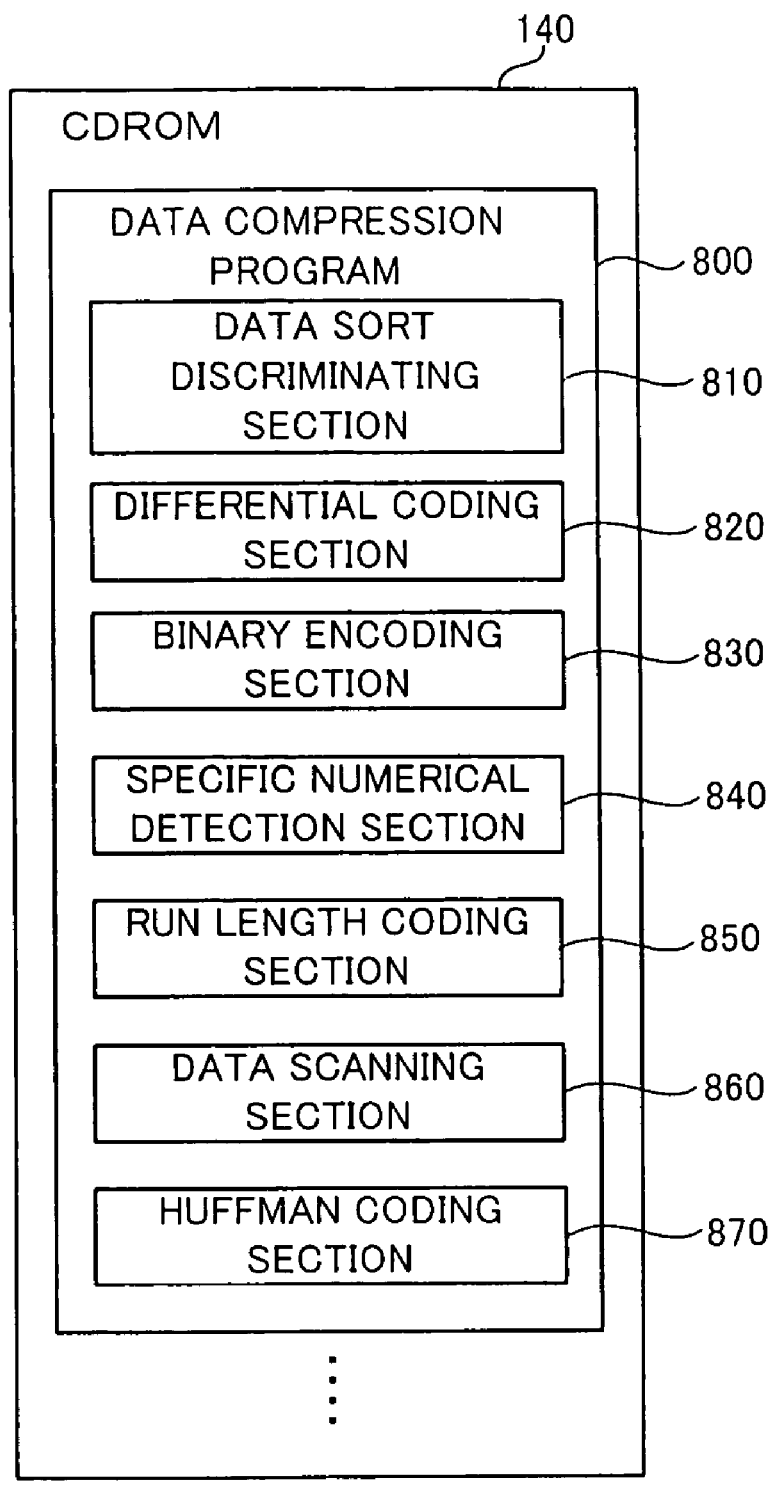
FIG. 17 is a typical structural view of a data compression program stored in a data compression program storage medium according to the second embodiment of the present invention.

FIG. 17 is a typical structural view of a data compression program stored in a data compression program storage medium according to the second embodiment of the present invention.

A data compression program 800 is stored in the CD-ROM 140.

The data compression program 800 comprises a data sort discriminating section 810, a differential coding section 820, a binary encoding section 830, a specific numerical detection section 840, a run length coding section 850, a data scanning section 860, and a Huffman coding section 870. The CD-ROM 140 stores therein various sorts of programs for executing a series of processing shown in FIG. 2 in the host controller 100 shown in FIG. 1, as well as the data compression program 600. Those programs are the same as the conventional one, and thus the redundant explanation will be omitted.

When the CD-ROM 140 shown in FIG. 17 is mounted on the host controller 100 shown in FIG. 5 so as to be accessed by the CD-ROM drive 116, the data compression program 600 stored in the CD-ROM 140 is up-loaded on the host controller 100 and is stored in the hard disk 104. Thus, the data compression program stored in the hard disk 104 is read from the hard disk 104 and is developed in the RAM 112. When the CPU 111 executes the developed data compression program, the host controller 100 operates as an apparatus for executing various sorts of processing as the host controller shown in FIG. 2, including processing as the data compression apparatus 500 shown in FIG. 16.

Here, when the data compression program 800 shown in FIG. 17 is installed in the host controller 100 and is executed in the CPU 111, the data compression program 800 implements the data compression apparatus 700 shown in FIG. 16 in the host controller 100. When the CPU 111 executes the data sort discriminating section 810, the differential coding section 820, the binary encoding section 830, the specific numerical detection section 840, the run length coding section 850, the data scanning section 860, and the Huffman coding section 870, those sections serve as program parts that cause the host controller 100 to operate as the data sort discriminating section 710, the differential coding section 720, the binary encoding section 730, the specific numerical detection section 740, the run length coding section 750, the data scanning section 760, and the Huffman coding section 770, respectively, which constitute the data compression apparatus 700 shown in FIG. 16. Functions of the sections 810 to 870 that constitute the data compression program 800 shown in FIG. 17, wherein those sections 810 to 870 are executed in the CPU 111, are the completely same as functions of the sections 710 to 770 that constitute the data compression apparatus 700 shown in FIG. 16, respectively. Accordingly, the above-mentioned explanation as to the data compression apparatus 700 shown in FIG. 16 and the detailed explanation, which will be described later, may serve as the explanation for the sections 810 to 870 that constitute the data compression program 800 shown in FIG. 17.

Incidentally, according to the first embodiment as mentioned above, FIG. 5 shows the hardware structure of the computer system as the host controller 100 (cf. FIG. 1) in which the data compression program shown in FIG. 6 is operative. Also in the second embodiment, the computer system shown in FIG. 5 is applicable. And thus the redundant explanation will be omitted.

The data compression program 800 shown in FIG. 17 is stored in the CD-ROM 140 also shown in FIG. 5.

Hereinafter, in explanation of the respective elements 710 to 770 of the data compression apparatus 700 shown in FIG. 16, with respect to the same elements as the respective elements 510 to 550 of the data compression apparatus 500 shown in FIG. 4 according to the first embodiment, the redundant explanation will be omitted.

First, the data structure of the image data of the input image file fed to the data compression apparatus 700 shown in FIG. 16, and the differential coding processing by the differential coding section 720 wherein the multiple-valued data is concerned, are the same as the data structure of the image data of the input image file fed to the data compression apparatus 500 shown in FIG. 4 according to the first embodiment, and the differential coding processing by the differential coding section 510 of the data compression apparatus 500, respectively, which are explained referring to FIG. 7 to FIG. 9. Hereinafter, there will be explained the processing by the differential coding section 720 wherein the data sort discriminating section 710 decides that the binary data is concerned.

When the differential coding section 720 receives from the data sort discriminating section 710 a decision result that the image data of the input image file now received is concerned with the binary data, even if two values constituting the image data are concerned with any values (for example, "01" and "FF" in the hexadecimal value), one of the two values is converted into "00" in the hexadecimal value, and another is converted into "80" in the hexadecimal value, and thereafter the differential coding section 720 performs the differential coding processing shown in FIG. 8.

Figure 18:
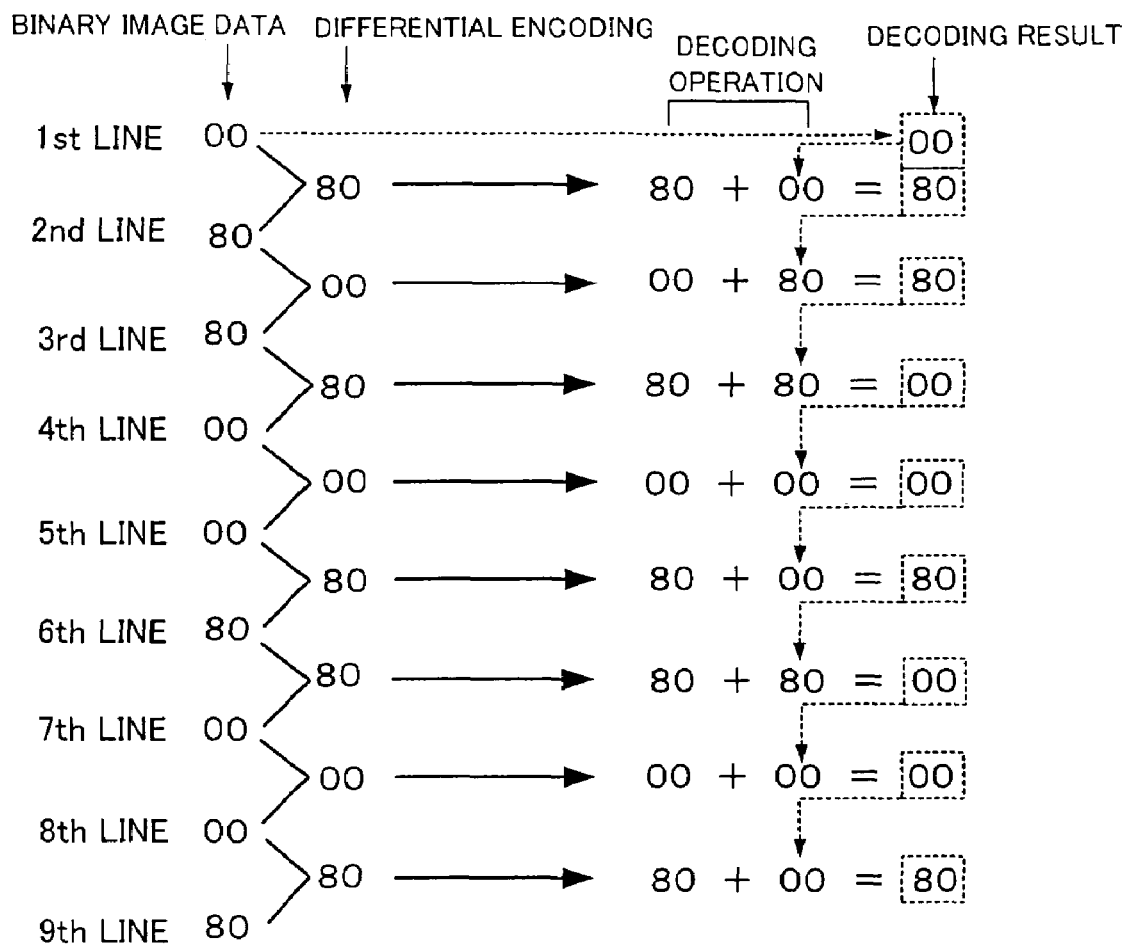
FIG. 18 is a view useful for understanding a differential coding processing wherein binary data consisting of 00 and 80is concerned.

FIG. 18 is a view useful for understanding a differential coding processing wherein binary data consisting of 00 and 80 is concerned.

It is assumed that the pixel values on the vertical line are expressed, as shown in the column of "BINARY IMAGE DATA" in FIG. 18, as set forth below.

"00 80 80 00 00 80 00 00 80 . . . "

where the pixel values are expressed by hexadecimal two digit (1 byte=8 bits), similar to that of FIG. 8.

First, with respect to the first line of pixel value "12", it is outputted directly.

Next, the first line of pixel value "00" is subtracted from the second line of pixel value "80" to output a value "80" of a result.

Next, the second line of pixel value "80" is subtracted from the third line of pixel value "80", and a value "80" of a result is outputted.

Next, the third line of pixel value "80" is subtracted from the fourth line of pixel value "00" to output a result. The result of the subtraction of "80" from "00" is a negative number. This negative number is expressed by "180" in 9 bits. Here, however, "1", which is 1 bit in the MSB (Most Significant Bit), is omitted, and only "80", which is 8 bits in the lower order of unit bit, is outputted.

Next, the fourth line of pixel value "00" is subtracted from the fifth line of pixel value "00", and a value "00" of a result is outputted.

This operation is repeated to output data appearing in the column of "DIFFERENTIAL ENCODING" in FIG. 8, as set forth below.

"(00) 80 00 80 00 80 80 00 80 . . . "

To decode the differential encoded data as mentioned above, the interface equipment 200 shown in FIG. 1 performs an operation as shown in the right side of FIG. 18.

This decoding operation is the same as the decoding operation explained referring to FIG. 8, except for that the numerical values to be treated are two values of "00" and "80", and thus the redundant explanation will be omitted.

Incidentally, as mentioned above, according to the differential coding section 720, in case of the binary data, even if binary values constituting the binary data are concerned with any values (e.g. "01" and "FF"), the binary values are converted into "00" and "80". Here the compression information, which is to be transmitted from the host controller 100 shown in FIG. 1 to the interface equipment 200, includes information as to an association between the binary values (e.g. "01" and "FF") and allocation values (e.g. "00" and "80"). The interface equipment 200 decodes the coded data to the binary data consisting of "00" and "80", as shown in the column of "DECODING RESULT" in FIG. 18, and then returns the binary data of "00" and "80" to the original binary values (e.g. "01" and "FF").

FIG. 19 is an explanatory view useful for understanding a binary coding processing in the binary coding section 730 shown in FIG. 16.

The binary coding section 730 performs the binary coding processing for binary image data consisting of "00" and "80" after the differential coding processing by the differential coding section 720 shown in FIG. 16.

It is assumed that the image data, which is subjected to the differential coding processing by the differential coding section 720 in FIG. 16, is expressed, as shown in the column of "DIFFERENTIAL CODED IMAGE DATA" in FIG. 19, as set forth below.

"00 00 00 00 00 80 80 80 . . . "

Here, two sort of numerical values of "00" and "80" are discriminated in one bit. Here, "00" is discriminated with "0" in one bit, and "80" is discriminated with "1" in one bit. The numerical sequence, as shown in the column of "DIFFERENTIAL CODED IMAGE DATA" in FIG. 19, as set forth below,

"00 00 00 00 00 80 80 80 . . . "

is converted into

"0 0 0 0 0 1 1 1 ..."

as shown in the column of "BINARY CODED BIT STREAM" in FIG. 19. And the bit stream is converted on a batch basis of 8 bits into

"07 C0 03 81 ..."

as shown in the column of "BITE STREAM SUBJECTED TO BITE-PACKING" in FIG. 19. The numerical sequence after the conversion is fed to the specific numerical detection section 740 and the run length coding section 750 in FIG. 16.

When the interface equipment 200 shown in FIG. 1 performs the decoding processing, the processing is carried out in the order reversed to the above-mentioned processing.

In case of the binary data, performing the binary encoding processing as explained in conjunction with FIG. 9 makes it possible to greatly decrease the amount of data.

Data, which is subjected to the differential coding processing by the differential coding section 720 shown in FIG. 16, is fed directly to the specific numerical detection section 740 and the run length coding section 750, when the data is concerned with the multiple-valued data. On the other hand, when the data is concerned with the binary data, the data is subjected to subjected to the binary encoding processing by the binary encoding section 730 and then fed to the specific numerical detection section 740 and the run length coding section 750.

The run length coding section 750 performs the coding processing for only the specific numerical values of a plurality of numerical values constituting the data received from the differential coding section 720. The specific numerical detection section 740 detects a numerical value (here, this numerical value is referred to a "compression subject numerical value") which is to be subjected to the coding processing by the run length coding section 750, of the data received from the differential coding section 720 or the binary encoding section 730, and the continued numbers of the compression subject numerical value.

The functions of the specific numerical detection section 740 and the run length coding section 750 in the present embodiment are the same as the functions of the specific numerical detection section 740 and the run length coding section 750 in the first embodiment shown in FIG. 1, and thus the redundant explanation will be omitted.

Further, the functions of the data scanning section 760 and the Huffman coding section 770 constituting the data compression apparatus 700 shown in FIG. 16 are also the same as the functions of the data scanning section 540 and the Huffman coding section 550 in the first embodiment shown in FIG. 4, and thus the redundant explanation will be omitted.

Incidentally, the data compression apparatus 700 shown in FIG. 16 is provided with the differential coding section 720 which is the same as the differential coding section 510 of the data compression apparatus 500 shown in FIG. 4. The use of the differential coding section 720 makes it possible, as mentioned above, to increase the frequency of occurrence of the numerical value "00", and thus it is preferable. But it is not always necessary for the present invention that the data compression apparatus 700 shown in FIG. 16 is provided with the differential coding section 720. And according to the present invention, it is acceptable that no differential coding processing is applied to the input data, and regarding the binary data it is fed directly to the binary encoding section 730, or regarding the multiple-valued data it is fed directly to the specific numerical detection section 740 and the run length coding section 750. Alternatively, it is acceptable that the differential coding section 720 is replaced by another coding section for performing a data compression processing.

Further, according to the data compression apparatus 700 shown in FIG. 16, also in a similar fashion to that of the first embodiment (cf. FIG. 4) as mentioned above, the Huffman coding section 770 is disposed after the run length coding section 750, so that the data, which is subjected to the coding processing by the run length coding section 750, is subjected to the Huffman coding processing. However, according to the present invention, it is not always necessary that the Huffman coding processing is applied to the data subjected to the coding processing by the run length coding section 750, and it is acceptable that the Huffman coding processing is replaced by another entropy coding processing, or alternatively it is acceptable that the data encoded by the run length coding section 750 is directly outputted from the data compression apparatus 700.

Furthermore, according to the present embodiment, the data compression apparatus 700 shown in FIG. 16 is provided with the data sort discriminating section 710 to discriminate whether the image data of the input image file is concerned with the binary data or the multiple-valued data. However, in the event that information indicative of a distinction between the binary data and the multiple-valued data is available from the exterior, the data sort discriminating section 710 is not always necessary for the present invention.

Still further, similar to the first embodiment, the second embodiment is also an example in which the present invention is applied to the LW data. However, the present invention is not restricted to one in which the subject of the data compression is concerned with only the LW data, and it is possible to expect a satisfactory data compression also when the present invention is applied, in case of some images, to the CT data and image data in which the LW data and the CT data are mixed.

As mentioned above, according to the data compression apparatus and the data compression program storage medium of the present invention, only the compression subject numerical value is encoded into the numerical value representative of the compression subject numerical value and the continued number. Thus this feature makes it possible to avoid such a situation that the redundancy is more increased than the original data, as explained referring to FIG. 3, and thereby improving bulk compressibility.

Here, the coding section is constructed so as to perform a coding in such a manner that a continued number of the same compression subject numerical value is expressed with different bit numbers in accordance with the continued number, for example, in such a manner that when a continued number of the same compression subject numerical value is not above than a predetermined number, the continued number is expressed with 1 unit bit number, and when the continued number exceeds the predetermined number, the continued number is expressed with 2 unit bit number. This feature makes it possible to perform the compression in the higher bulk compressibility when the continued number of the same compression subject numerical number is larger and thereby further improving the bulk compressibility.

Further, when the data compression apparatus is provided with the second data compression section, the difference between the continued same numerical values becomes zero in numerical value, and thus a probability of occurrence of zero in numerical value is increased. Accordingly, the combination of the second data compression section with the first data compression section makes it possible to further improve the bulk compressibility.

Here, the difference of the numerical values is determined. For example, in the event that the numerical value is expressed with 1 byte (8 bits), the difference is expressed with 9 bits including the sign. As mentioned in the embodiments of the present invention, preserving the numerical value of the head as it is makes it possible to omit 1 bit of MSB as the numerical value representative of the difference, and preserving 8 bits (1 byte) of the lower order of unit bit makes it possible to restore the original numerical value.

Thus, the second data compression section is constructed so as to perform such a processing that the numerical value of the head in each of distinctions, wherein the continuity of the numerical values constituting the entered data is sequentially divided, is outputted directly, and with respect to the numerical values other than the numerical value of the head, there is outputted the numerical value represented by lower order of unit bits of the difference between adjacent numerical values. This feature makes it possible to prevent an increment of one bit on one differential value by the difference, and thereby further improving the bulk compressibility.

Further, when the data compression apparatus is provided with the third data compression section, it is possible to expect further improving the bulk compressibility by the entropy coding.

Furthermore, according to the data compression apparatus of the present invention, the structural arrangement of the fourth data compression section makes it possible in case of the binary data to create new multiple-valued data in such a manner that the binary value is discriminated in one bit and the continuity of one bit is expressed for unit bit number on a batch basis, and thereby further improving the bulk compressibility on the binary data.

Still furthermore, when the data compression apparatus is provided with the fifth data compression section, the difference between the continued same numerical values becomes zero in numerical value, and thus a probability of occurrence of zero in numerical value is increased. Accordingly, the combination of the fifth data compression section with the first and fourth data compression section makes it possible to further improve the bulk compressibility.

Here, the difference of the numerical values is determined. For example, in the event that the numerical value is expressed with 1 byte (8 bits), the difference is expressed with 9 bits including the sign. As mentioned in the embodiments of the present invention, preserving the numerical value of the head as it is makes it possible to omit 1 bit of MSB as the numerical value representative of the difference, and preserving 8 bits (1byte) of the lower order of unit bit makes it possible to restore the original numerical value.

Thus, the fifth data compression section is constructed so as to perform such a processing that the numerical value of the head in each of distinctions, wherein the continuity of the numerical values constituting the entered data is sequentially divided, is outputted directly, and with respect to the numerical values other than the numerical value of the head, there is outputted the numerical value represented by lower order of unit bits of the difference between adjacent numerical values. This feature makes it possible to prevent an increment of one bit on one differential value by the difference, and thereby further improving the bulk compressibility.

Here, in case of the numerical sequence consisting of 00 and 80 hexadecimally, a result of the differential operation is also expressed by 00 and 80 excepting for the sign bit. Accordingly, in the event that the data to be compressed is concerned with the binary data, when two sort of numerical values constituting the binary data is discriminated with 00 and 80 hexadecimally, the numerical values are expressed as the binary data consisting of 00 and 80 also after the differential operation is performed, and the differential operation causes a probability of occurrence of zero (00) in numerical value to be increased. Thus, this feature may contribute to a further improvement of the bulk compressibility.

Here, the provision of the fourth data compression section is preferable in a case where data to be compressed is concerned with the binary data, or in a case where data to be compressed includes the binary data. On the other hand, in order to discriminate as to whether data to be compressed is concerned with the binary data or the multiple-valued data, it is acceptable, when distinction information is available, that the information is applied, or alternatively, it is acceptable that the data sort discriminating section is provided so that the data to be compressed is searched to discriminate as to whether the data to be compressed is concerned with the binary data or the multiple-valued data.

While the present invention has been described with reference to the particular illustrative embodiments, it is not to be restricted by those embodiments but only by the appended claims. It is to be appreciated that those skilled in the art can change or modify the embodiments without departing from the scope and sprit of the present invention.

What is claimed is:

1. A data compression apparatus that applies a data compression processing to data to be compressed, the data consisting of continued numerical values represented by a predetermined number of unit bits, the data compression apparatus having a first data compression section comprising:

a numerical detection section that detects the existence of one or a plurality of compression subject numerical values being equivalent to a predetermined value from among the data to be compressed and a number of continuities counting the same compression subject numerical values being equivalent to the predetermined value; and a coding section that provides such a coding processing that of the data to be compressed, the compression subject numerical values being different from the predetermined value are directly outputted, and the compression subject numerical values being equivalent to the predetermined value are coded into the compression subject numerical values being equivalent to the predetermined value and numerical value representative of the number of continuities counting the compression subject numerical values being equivalent to the predetermined value, and then outputted;

wherein before the first data compression section, there is disposed a second data compression section that performs such a processing that there is determined a difference between adjacent numerical values on the continuity of numerical values constituting the data to be compressed so as to create data consisting of the continued numerical values representative of the difference, and the created data is transferred to the first data compression section; and wherein the second coding section performs such a processing that the numerical value of the head in each of distinctions, wherein the continuity of the numerical values constituting the data to be compressed is sequentially divided, is outputted directly, and with respect to the numerical values other than the numerical value of the head, there is outputted the numerical value represented by lower order of unit bits of the difference between adjacent numerical values.

2. A data compression apparatus according to claim 1, wherein the coding section performs a coding to express the number of continuities of the same compression subject numerical values being equivalent to the predetermined value with the different bit number in accordance with the number of continuities of the same compression subject numerical values being equivalent to the predetermined value.

3. A data compression apparatus according to claim 2, wherein the coding section performs such a coding that when the number of continuities of the same compression subject numerical values being equivalent to the predetermined value is not more than a predetermined number, the number of continuities is expressed with one-unit bit number, and when the number of continuities of the same compression subject numerical values being equivalent to the predetermined value is more than the predetermined number, the number of continuities is expressed with two-unit bit number.

4. A data compression apparatus according to claim 1, wherein after the first data compression section, there is disposed a third data compression section that applies an entropy coding to the data which is subjected to the coding by the first data compression section.

5. A data compression apparatus according to claim 1, wherein the data compression apparatus further comprises a fourth compression section that provide such a processing that in a case where data to be compressed is concerned with the binary data represented by only two sorts of numerical values, there is created new data to be compressed, which consists of continued numerical values represented by a unit bit number, in such a manner that the two sorts of numerical values are discriminated in one bit and the continuity of the one bit is expressed for unit bit number on a batch basis, and the created new data is transferred to the first data compression section.

6. A data compression apparatus according to claim 5, wherein before the first data compression section and the fourth data compression section, there is disposed a fifth data compression section that performs a processing in which differences between the adjacent numerical values on the continuity of the numerical values constituting the data to be compressed are determined so as to create data consisting of a series of numerical values representative of the differences.

7. A data compression apparatus according to claim 5, wherein the data compression apparatus further comprises a data sort discriminating section that discriminates whether the data to be compressed is the binary data including only two sorts of numerical values or a multiple-valued data including numerical values not less than three sorts.

8. A data compression apparatus according to claim 1, wherein the compression subject numerical values being different from the predetermined value which are directly outputted comprise original data.

9. A data compression apparatus that applies a data compression processing to data to be compressed, the data consisting of continued numerical values represented by a predetermined number of unit bits, the data compression apparatus having a first data compression section comprising:
    a numerical detection section that detects the existence of one or a plurality of compression subject numerical values being equivalent to a predetermined value from among the data to be compressed and a number of continuities counting the same compression subject numerical values being equivalent to the predetermined value; and
    a coding section that provides such a coding processing that of the data to be compressed, the compression subject numerical values being different from the predetermined value are directly outputted, and the compression subject numerical values being equivalent to the predetermined value are coded into the compression subject numerical values being equivalent to the predetermined value and numerical value representative of the number of continuities counting the compression subject numerical values being equivalent to the predetermined value, and then outputted;

wherein the data compression apparatus further comprises a fourth compression section that provide such a processing that in a case where data to be compressed is concerned with the binary data represented by only two sorts of numerical values, there is created new data to be compressed, which consists of continued numerical values represented by a unit bit number, in such a manner that the two sorts of numerical values are discriminated in one bit and the continuity of the one bit is expressed for unit bit number on a batch basis, and the created new data is transferred to the first data compression section;

wherein before the first data compression section and the fourth data compression section, there is disposed a fifth data compression section that performs a processing in which differences between the adjacent numerical values on the continuity of the numerical values constituting the data to be compressed are determined so as to create data consisting of a series of numerical values representative of the differences; and wherein the fifth data compression section performs such a processing that the numerical value of the head in each of distinctions, wherein the continuity of the numerical values constituting the data to be compressed is sequentially divided, is outputted directly, and with respect to the numerical values other than the numerical value of the head, there is outputted the numerical value represented by lower order of unit bits of the difference between adjacent numerical values.

10. A data compression apparatus that applies a data compression processing to data to be compressed, the data consisting of continued numerical values represented by a predetermined number of unit bits, the data compression apparatus having a first data compression section comprising:
    a numerical detection section that detects the existence of one or a plurality of compression subject numerical values being equivalent to a predetermined value from among the data to be compressed and a number of continuities counting the same compression subject numerical values being equivalent to the predetermined value; and
    a coding section that provides such a coding processing that of the data to be compressed, the compression subject numerical values being different from the predetermined value are directly outputted, and the compression subject numerical values being equivalent to the predetermined value are coded into the compression subject numerical values being equivalent to the predetermined value and numerical value representative of the number of continuities counting the compression subject numerical values being equivalent to the predetermined value, and then outputted;

wherein the data compression apparatus further comprises a fourth compression section that provide such a processing that in a case where data to be compressed is concerned with the binary data represented by only two sorts of numerical values, there is created new data to be compressed, which consists of continued numerical values represented by a unit bit number, in such a manner that the two sorts of numerical values are discriminated in one bit and the continuity of the one bit is expressed for unit bit number on a batch basis, and the created new data is transferred to the first data compression section;

wherein before the first data compression section and the fourth data compression section, there is disposed a fifth data compression section that performs a processing in which differences between the adjacent numerical values on the continuity of the numerical values constituting the data to be compressed are determined so as to create data consisting of a series of numerical values representative of the differences; and, wherein the fifth data compression section performs such a processing that when the data to be compressed is concerned with the binary data, two sorts of numerical values constituting the binary data are discriminated with 00 and 80 hexadecimally, and the difference is determined on the data to be compressed, which consists of the continuity of 00 and 80, so that there is created a new data to be compressed, which consists of continued numerical values representative of the difference.

11. A computer-readable data compression program storage medium storing a data compression program, which causes an information processing apparatus to operate as a data compression apparatus that applies a data compression processing to data to be compressed, the data consisting of continued numerical values represented by a predetermined number of unit bits, the data compression apparatus having a first data compression section comprising:
  a numerical detection section that detects the existence of one or a plurality of compression subject numerical values being equivalent to a predetermined value from among the data to be compressed and a number of continuities counting the same compression subject numerical values being equivalent to the predetermined value; and
  a coding section that provides such a coding processing that of the data to be compressed, the compression subject numerical values being different from the predetermined value are directly outputted, and the compression subject numerical values being equivalent to the predetermined value are coded into the compression subject numerical values being equivalent to the predetermined value and numerical value representative of the number of counting continuities of the compression subject numerical values being equivalent to the predetermined value, and then outputted;
  wherein before the first data compression section, there is disposed a second data compression section that performs such a processing that there is determined a difference between adjacent numerical values on the continuity of numerical values constituting the data to be compressed so as to create data consisting of the continued numerical values representative of the difference, and the created data is transferred to the first data compression section; and
  wherein the second coding section performs such a processing that the numerical value of the head in each of distinctions, wherein the continuity of the numerical values constituting the data to be compressed is sequentially divided, is outputted directly, and with respect to the numerical values other than the numerical value of the head, there is outputted the numerical value represented by lower order of unit bits of the difference between adjacent numerical values.

12. A computer-readable data compression program storage medium storing a data compression program according to claim 11, wherein the coding section performs a coding to express the number of continuities of the same compression subject numerical values being equivalent to the predetermined value with the different bit number in accordance with the number of continuities of the same compression subject numerical values being equivalent to the predetermined value.

13. A computer-readable data compression program storage medium storing a data compression program according to claim 12, wherein the coding section performs such a coding that when the number of continuities of the same compression subject numerical values being equivalent to the predetermined value is not more than a predetermined number, the number of continuities is expressed with one-unit bit number, and when the number of continuities of the same compression subject numerical values being equivalent to the predetermined value is more than the predetermined number, the number of continuities is expressed with two-unit bit number.

14. A computer-readable data compression program storage medium storing a data compression program according to claim 11, wherein after the first data compression section, there is disposed a third data compression section that applies an entropy coding to the data which is subjected to the coding by the first data compression section.

15. A computer-readable data compression program storage medium storing a data compression program according to claim 11, wherein the data compression apparatus further comprises a fourth compression section that provide such a processing that in a case where data to be compressed is concerned with the binary data represented by only two sorts of numerical values, there is created new data to be compressed, which consists of continued numerical values represented by a unit bit number, in such a manner that the two sorts of numerical values are discriminated in one bit and the continuity of the one bit is expressed for unit bit number on a batch basis, and the created new data is transferred to the first data compression section.

16. A computer-readable data compression program storage medium storing a data compression program according to claim 15, wherein before the first data compression section and the fourth data compression section, there is disposed a fifth data compression section that performs a processing in which differences between the adjacent numerical values on the continuity of the numerical values constituting the data to be compressed are determined so as to create data consisting of a series of numerical values representative of the differences.

17. A computer-readable data compression program storage medium storing a data compression program according to claim 15, wherein the data compression apparatus further comprises a data sort discriminating section that discriminates whether the data to be compressed is the binary data including only two sorts of numerical values or a multiple-valued data including numerical values not less than three sorts.

18. A computer-readable data compression program storage medium storing a data compression program according to claim 11, wherein the compression subject numerical values being different from the predetermined value which are directly outputted comprise original data.

19. A computer-readable data compression program storage medium storing a data compression program, which causes an information processing apparatus to operate as a data compression apparatus that applies a data compression processing to data to be compressed, the data consisting of continued numerical values represented by a predetermined number of unit bits, the data compression apparatus having a first data compression section comprising:

a numerical detection section that detects the existence of one or a plurality of compression subject numerical values being equivalent to a predetermined value from among the data to be compressed and a number of continuities counting the same compression subject numerical values being equivalent to the predetermined value; and a coding section that provides such a coding processing that of the data to be compressed, the compression subject numerical values being different from the predetermined value are directly outputted, and the compression subject numerical values being equivalent to the predetermined value are coded into the compression subject numerical values being equivalent to the predetermined value and numerical value representative of the number of counting continuities of the compression subject numerical values being equivalent to the predetermined value, and then outputted;

wherein the data compression apparatus further comprises a fourth compression section that provide such a processing that in a case where data to be compressed is concerned with the binary data represented by only two sorts of numerical values, there is created new data to be compressed, which consists of continued numerical values represented by a unit bit number, in such a manner that the two sorts of numerical values are discriminated in one bit and the continuity of the one bit is expressed for unit bit number on a batch basis, and the created new data is transferred to the first data compression section;

wherein before the first data compression section and the fourth data compression section, there is disposed a fifth data compression section that performs a processing in which differences between the adjacent numerical values on the continuity of the numerical values constituting the data to be compressed are determined so as to create data consisting of a series of numerical values representative of the differences; and wherein the fifth data compression section performs such a processing that the numerical value of the head in each of distinctions, wherein the continuity of the numerical values constituting the data to be compressed is sequentially divided, is outputted directly, and with respect to the numerical values other than the numerical value of the head, there is outputted the numerical value represented by lower order of unit bits of the difference between adjacent numerical values.

20. A computer-readable data compression program storage medium storing a data compression program, which causes an information processing apparatus to operate as a data compression apparatus that applies a data compression processing to data to be compressed, the data consisting of continued numerical values represented by a predetermined number of unit bits, the data compression apparatus having a first data compression section comprising:

a numerical detection section that detects the existence of one or a plurality of compression subject numerical values being equivalent to a predetermined value from among the data to be compressed and a number of continuities counting the same compression subject numerical values being equivalent to the predetermined value; and a coding section that provides such a coding processing that of the data to be compressed, the compression subject numerical values being different from the predetermined value are directly outputted, and the compression subject numerical values being equivalent to the predetermined value are coded into the compression subject numerical values being equivalent to the predetermined value and numerical value representative of the number of counting continuities of the compression subject numerical values being equivalent to the predetermined value, and then outputted;

wherein the data compression apparatus further comprises a fourth compression section that provide such a processing that in a case where data to be compressed is concerned with the binary data represented by only two sorts of numerical values, there is created new data to be compressed, which consists of continued numerical values represented by a unit bit number, in such a manner that the two sorts of numerical values are discriminated in one bit and the continuity of the one bit is expressed for unit bit number on a batch basis, and the created new data is transferred to the first data compression section;

wherein before the first data compression section and the fourth data compression section, there is disposed a fifth data compression section that performs a processing in which differences between the adjacent numerical values on the continuity of the numerical values constituting the data to be compressed are determined so as to create data consisting of a series of numerical values representative of the differences; and wherein the fifth data compression section performs such a processing that when the data to be compressed is concerned with the binary data, two sorts of numerical values constituting the binary data are discriminated with 00 and 80 hexadecimally, and the difference is determined on the data to be compressed, which consists of the continuity of 00 and 80, so that there is created a new data to be compressed, which consists of continued numerical values representative of the difference.

* * * * *